(12) United States Patent
Kawamura et al.

(10) Patent No.: US 6,589,871 B2
(45) Date of Patent: Jul. 8, 2003

(54) PROCESSING METHOD, MEASURING METHOD AND PRODUCING METHOD OF SEMICONDUCTOR DEVICES

(75) Inventors: Yoshio Kawamura, Kokubunji (JP); Souichi Katagiri, Kodaira (JP); Kan Yasui, Kodaira (JP); Masayuki Nagasawa, Kawagoe (JP); Ui Yamaguchi, Saitama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/941,757

(22) Filed: Aug. 30, 2001

(65) Prior Publication Data

US 2002/0076933 A1 Jun. 20, 2002

(30) Foreign Application Priority Data

Dec. 18, 2000 (JP) ........................................ 2000-383194

(51) Int. Cl.[7] ............................................. H01L 21/302
(52) U.S. Cl. .................... 438/691; 438/692; 438/759
(58) Field of Search ................... 438/690, 691, 438/692, 759

(56) References Cited

U.S. PATENT DOCUMENTS 6,048,763 A * 4/2000 Doan et al. ................. 438/239

2002/0022936 A1 * 2/2002 Stanke ........................ 702/81

FOREIGN PATENT DOCUMENTS

| JP | 5-270973 | 3/1992 |
| JP | 6-155286 | 11/1992 |
| JP | 7-314298 | 5/1994 |
| JP | 9-232260 | 2/1996 |

* cited by examiner

*Primary Examiner*—Amir Zarabian
*Assistant Examiner*—Toniae M. Thomas

(57) ABSTRACT

A processing method capable of presenting the processing condition with a high accuracy to improve the productivity, including a step of applying a first processing to a first substrate and a step of applying a second processing to the first substrate or the second processing to a second substrate and determining a correlation function for each of in-plane positions as the data for the difference in a plurality of processing steps to each of the in-plane positions in view of on the in-plain distribution data to the in-plane position of each of the substrate as a result of the plurality of processings, calculating the in-plain distribution characteristics of the substrate under a desired processing condition in view of the correlation function and processing the substrate based on the in-plane distribution characteristics.

6 Claims, 23 Drawing Sheets

PROCESSING CONDITION n,
CORRELATION FUNCTION Fn (r, h)

PROCESSING CONDITION n2,
CORRELATION FUNCTION Fn2 (r, h)

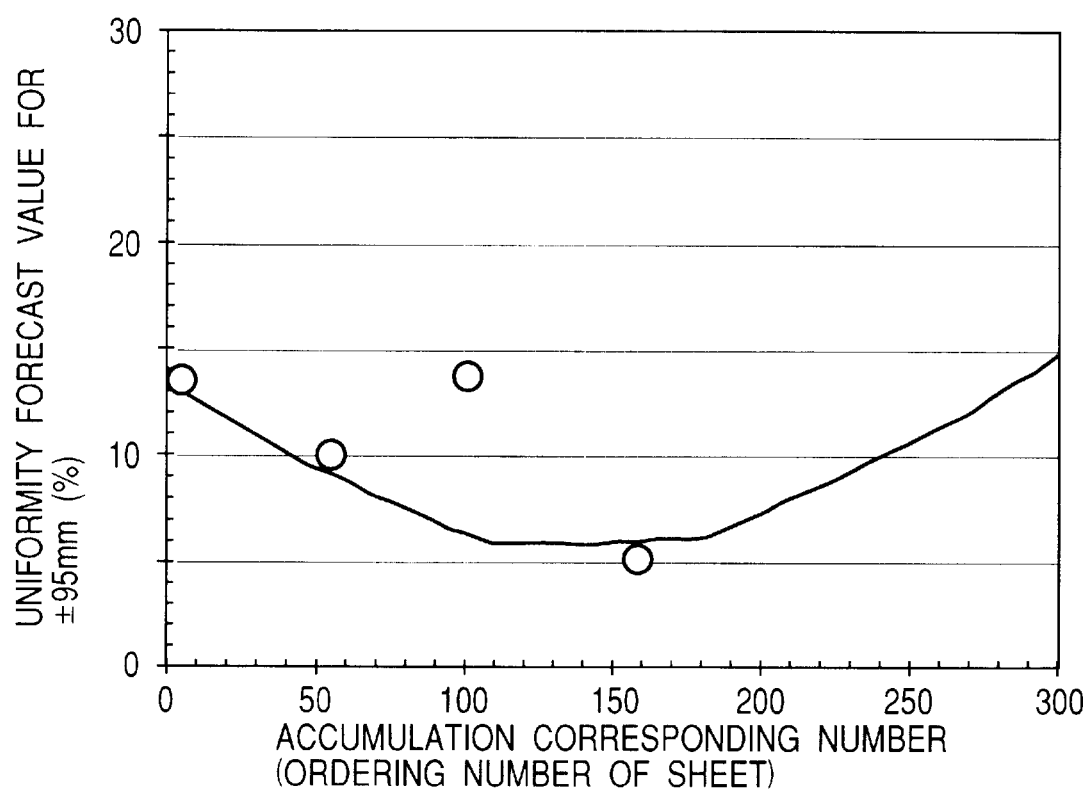

PROCESSING METHOD, MEASURING METHOD AND PRODUCING METHOD OF SEMICONDUCTOR DEVICES

BACKGROUND OF THE INVENTION

This invention relates to a processing method suitable for processing of a semiconductor substrate or the like, a measuring method and a method of producing a semiconductor device.

In a producing process for a semiconductor device of a high integration degree such as a DRAM (Dynamic Random Access Memory) having an integration degree of 256 Mbits or more, a fine pattern with a minimum size of 0.2 $\mu$m or less is formed. When such a fine pattern is formed with a high accuracy by using photolithography, it is necessary to make the wavelength of exposure light shorter and increase the numerical aperture. Correspondingly, an allowable focal depth of a reduction projection exposure system used for the photolithographic step becomes shallower. For exposure and transfer of a fine circuit pattern at a high resolution to a photosensitive film (photoresist film) on a thin film formed on the surface of a substrate in the photolithographic step, a flatness of 0.3 $\mu$m or less is required for the film of the photosensitive surface as an exposed surface.

To obtain the flatness on the surface of the photosensitive film, Japanese Patent Laid-Open Hei 7-314298 discloses a reflow flattening method of softening to reflow an insulation film as an underlayer for forming the photosensitive film. Further, there are known an etching method of dissolving to flatten convex portions on an insulation film and a chemical mechanical polishing method (CMP) of fabricating an insulation film mechano-chemically by using a slurry containing an abrasive as a processing liquid and a polishing pad.

The existent reflow fattening method or etching method can locally smooth stepped portions but has no consideration in that a degree of flatness to satisfy an allowable range of a shallow focal depth of an exposure device cannot be obtained over a wide region of a semiconductor substrate (diameter of 300 mm or more). The chemical mechanical polishing method has been introduced in recent years in the semiconductor producing process as a technique capable of obtaining better flatness compared with the reflow flattening method. The chemical mechanical polishing method is adapted to polish the surface of a substrate by pressing a soft polishing cloth (a polishing pad made of polyurethane having a longitudinal elastic coefficient of 1000 kg/cm$^2$ or less) as a polishing member to a thin film surface formed on the surface of a substrate. In this method, as the pressing force of the polishing member to the semiconductor substrate is larger, that is, as the processing surface pressure is higher, flatness on the surface of the substrate after fabrication is worsened. However, when the fabrication surface pressure is lowered to reduce the phenomenon of worsening flatness, the processing efficiency is lowered to increase the processing time and lower the throughput. Further, no consideration has been taken in that the flatness of the substrate surface after processing is lowered due to the pressing force to the substrate surface or aging change of the polishing pad surface.

On the other hand, Japanese Patent Laid-Open Hei 9-232260 discloses a technique of processing the substrate surface by using a abrasive plate (fixed abrasive particle disk) in which polishing abrasive particles are compacted by a resin instead of using the polishing agent and the polishing cloth. Since the abrasive plate is harder compared with the polishing cloth (for example, having longitudinal elastic coefficient of 5000 kg/cm$^2$ or more), the flattening performance for the substrate surface in a circuit pattern region of an unevenned shape has been improved but it requires time and labor to optimize the countermeasure to reduce a so-called edge sagging in which the processing characteristics for the outer peripheral surface of the substrate is not uniform and, further, no consideration has been taken in that forecasting of aging change is difficult.

As an example for the countermeasure reducing the edge sagging, Japanese Patent Laid-Open Hei 6-155286, for example, discloses a method of preventing excessive polishing for the outer periphery of a wafer by disposing an inclined surface to the structure of the inner wall surface of a guide formed to the outer periphery of the wafer and the publication discloses data showing the effect thereof. However, the data showing the effect are discontinuous such as 3, 5 and 10 degree of angle of inclination, so that optimal conditions or allowable range are not clear and it has no consideration in that labor and time are required for optimization in a case where a user mass produces semiconductor devices in an actual production line at high reliability and yield.

The present inventors have examined the correlation for a plurality of measuring data of in-plane distribution in the step of producing semiconductor devices, estimated the in-plane distribution characteristics for an unknown processing conditions in comparison with the correlation function of known data and have experimentally found for the first time that an optimum processing condition can be presented.

Further, although not regarding the polishing method, Japanese Patent Laid-Open Hei 5-270973 discloses a technique, to determine the processing condition based on the comparison with the known correlation function of data, of measuring the in-plane resistivity in the transverse cross section of a single crystal rod with respect to a plurality of different magnetic field intensities respectively for making the distribution uniform for the resistivity in the plane of the silicon wafer and determining the magnetic field intensity with a small distribution of the in-plane resistivity based on the correlationship. However, this invention has no consideration on the determination of an estimate value with a fine accuracy.

OBJECT OF THE INVENTION

At first, this invention intends to provide a processing method capable of presenting a processing condition with a high accuracy and improving the productivity.

Secondly, this invention intends to provide a method of producing a semiconductor device capable of presenting a processing condition with a high accuracy and improving the productivity.

Thirdly, this invention intends to provide a measuring method for obtaining products with a high accuracy.

SUMMARY OF THE INVENTION

To attain the first object, the processing method according to this invention comprises:
  a step of applying a first processing to a first substrate;
  a step of applying a second processing to the first substrate or applying the second processing to a second substrate;
  determining a correlation function for each of in-plane positions as data for the difference in a plurality of processing steps for each of in-plane positions, based on the in-plane distribution data for the in-plane position of each of the substrates as the result of the plurality of processings;

calculating the in-plane distribution characteristics of a substrate under a desired processing condition in view of the correlation function; and processing the substrate based on the in-plane distribution characteristics.

Further, To attain the first object, the processing method according to this invention comprises:

a step of applying a first processing to a first substrate;

a step of applying a second processing to the first substrate or applying the second processing to a second substrate;

determining a correlation function for each of in-plane positions as data for the difference in a plurality of processing steps for each of in-plane positions, based on the in-plane distribution data for the in-plane position of each of the substrates as the result of the plurality of processings;

calculating the in-plane distribution characteristics of a substrate under a desired processing condition in view of the correlation function; and processing the substrate in view of the in-plane distribution characteristics, based on the processing condition to provide minimum uniformness.

Processing based on the processing condition to provide minimum uniformness does not always mean processing under the processing condition in which the uniformness takes a minimum value but includes also a case of processing, for example, under the processing condition within an allowable range for 10% relative to the minimum value for the uniformness.

In the processing methods described above, each of the first processing and the second processing may be chemical mechanical polishing. Further, each of the first processing and the second processing may be plasma processing and the processing for the substrate may be etching or film deposition.

Further, the method of producing a semiconductor device according to this invention to attain the second object comprises, for producing a semiconductor device having a transistor and a capacitor, processing a desired surface on a semiconductor substrate by chemical mechanical polishing, or etching or film deposition according to each of the processing methods described above.

A measuring method according to this invention to attain the third object comprises:

a step of applying a first processing to a first substrate;

a step of applying a second processing to the first substrate or applying the second processing to a second substrate;

determining a correlation function for each of in-plane positions as data for the difference in a plurality of processing steps for each of in-plane positions, based on the in-plane distribution data for the in-plane position of each of the substrates as the result of the plurality of processings;

calculating the in-plane distribution characteristics of a substrate under a desired processing condition in view of the correlation function; and deciding the processing condition to provide minimum uniformness based on the in-plane distribution characteristics.

BRIEF DESCRIPTION OF THE DRAWINGS

FIG. 13 is a graph showing the aging change for the uniformness of the polishing rate in the sixth embodiment according to this invention;

DETAILED DESCRIPTION OF THE PREFERRED EMBODIMENTS

Figure 1:
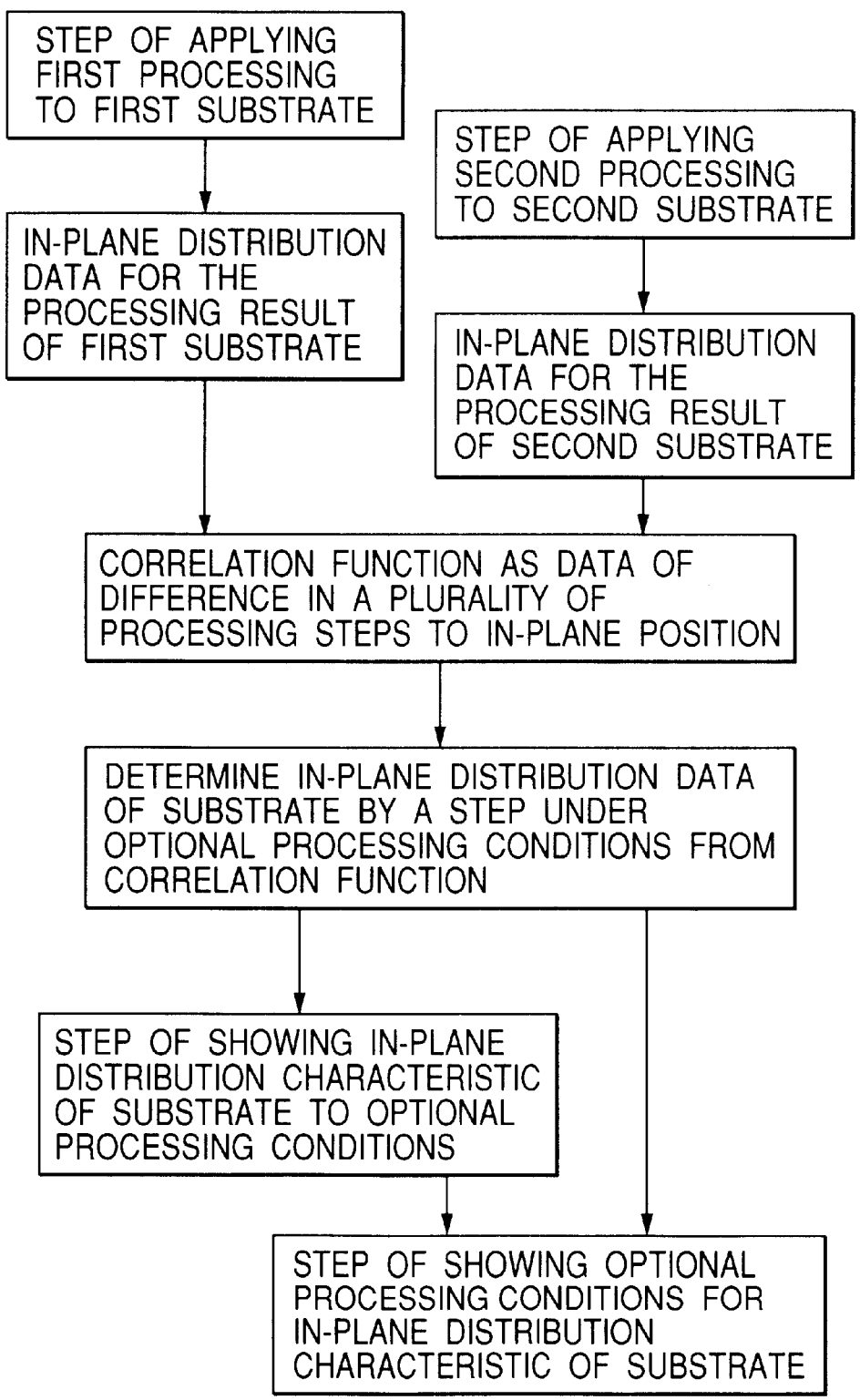
FIG. 1 shows a flow illustrating procedures for the method of producing a semiconductor device in a first embodiment according to this invention.

This invention will be explained by way of preferred embodiments with reference to the drawings. In each of the drawings, those portions having identical functions carry same reference numerals.

(Embodiment 1)

FIG. 1 is a schematic view showing procedures for the method of producing a semiconductor device in a first embodiment according to this invention.

In the method of producing the semiconductor device, after the step of applying a first processing to a first substrate and a step of applying a second processing to a second substrate, in-plane distribution data as the result of processing the first substrate and in-plane distribution data as the result of processing the second substrate are determined using the difference in each of the processing steps as the parameter. Then, using the in-plane distribution data, a correlation function for the processing condition is determined as the data for the change of the processing step at the identical in-plane position by using each of the in-plane positions as the parameter. The correlation function can be calculated by the method of regressive calculation for logarithm, exponent and power such as a least square method or a linear regression approximation, as well as an exponential function approximation or a higher function approximation, providing that data at one identical in-plane position under at least two different processing conditions is present. To improve the reliability of the correlation function, data for two or more of plural processing conditions may be used and, when used under a usual process, a correlation function of a relatively high reliability can be determined if the two processing conditions are known. Then, the in-plane distribution characteristics over a wide range of processing conditions can be estimated on actually small measured data by successively calculating the in-plane distribution characteristics for unknown values for the processing conditions based on the correlation function.

As described above, it is possible to convert and forecast the in-plane distribution characteristics of a substrate in view of the correlation function at each of the in-plane positions to thereby exhibit the in-plane distribution characteristics of the substrate under a desired processing conditions, and the processing condition for optimizing the in-plane distribution characteristics of the substrate can be presented.

It is also possible to take the in-plane distribution data as the processing result of the first substrate after the step of applying the first processing to the first substrate and, successively, to take the in-plane distribution data as the processing result of the second substrate after the step of applying the second processing to the second substrate. Further, it is also possible to repeat the steps of taking the in-plane distribution data as the result of processing to the first substrate after the step of applying the first processing to the first substrate, conducting a step of applying a second processing using the first substrate after taking the data as a second substrate and, successively, taking the in-plane distribution data as the result of processing to the second substrate.

(Embodiment 2)

Figure 2:
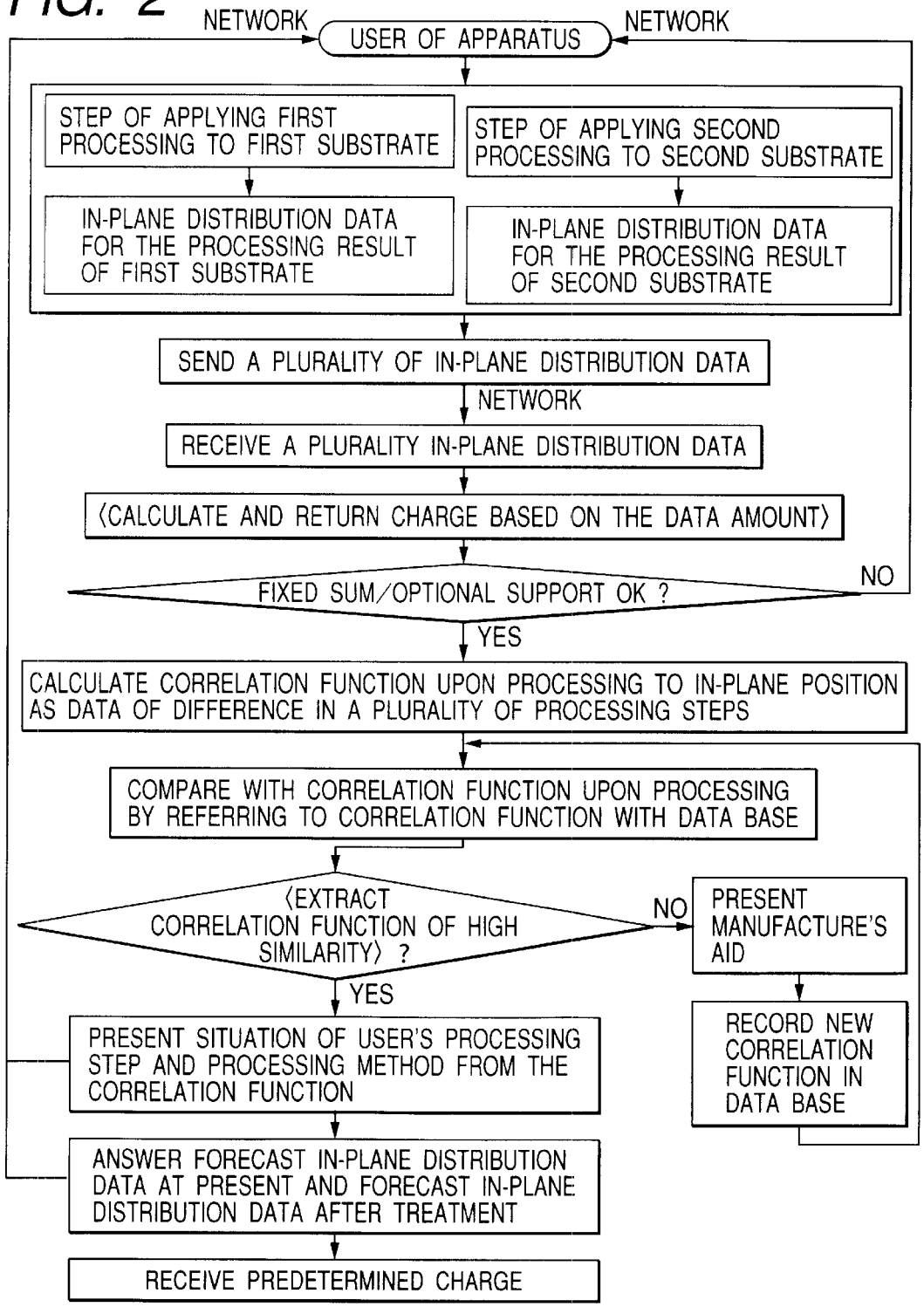
FIG. 2 shows a flow illustrating procedures for the method of producing a semiconductor device in a second embodiment according to this invention.

FIG. 2 is a schematic view showing procedures for the method of producing a semiconductor device of a second embodiment according to this invention.

In a method of producing a semiconductor device by a device user who introduced a semiconductor producing apparatus from a manufacturer, after the step of applying a first processing to a first substrate and a step of applying a second process to a second substrate, in-plane distribution data as the result of processing to the first substrate and in-plane distribution data as the result of processing to the second substrate are determined. The plurality of pieces in-plane distribution data are sent to the manufacturer. As the sending method, the data is sent by way of a network such as a data communication line. Depending on the situation, the data may be sent also in the form of a data file contained in a magnetic or optical desk medium. After receiving the plurality of pieces of in-plane distribution data, the manufacturer calculates charge in accordance with a predetermined rule based on the amount of data and returns the same to the user, for example, by way of the network. In a case where a support contract based on a predetermined sum is made between the manufacturer and the user, the process goes to the next step without sending back by way of the network. In a case of an optional support contract, the process goes to the next step after obtaining the user's answer for recognizing the sum of the charge returned by way of the network. Then, in the next step, the in-plane distribution data is determined using the difference in each of the processing steps as a parameter by using the sent data. Using each of the in-plane positions as the parameter, the correlation function for the processing condition is determined by the method described previously as the data for the change of the processing step at the identical in-plane position.

Then, the in-plane distribution characteristics of the substrate are calculated and estimated in view of the correlation function at each of the in-plane positions. The estimated characteristics as the result of calculation and the similar characteristics in the database owned by the manufacturer are compared with each other and the processing condition for the characteristics of high similarity is referred to. In a case where a correlation function of high similarity with the estimated characteristics cannot be extracted, the manufacturer conducts follow-up such as inquiry to the user about the data showing the processing conditions and the various states of the semiconductor producing device by way of the network, and a new correlation function is registered in the manufacturer's database. After extracting the correlation function of high similarity, the manufacturer presents the situation of the processing step and the countermeasure to be taken in the user by return sending through the network. Further, the manufacturer answers by sending the forecast in-plane distribution characteristics in a case where the user continues the processing step in the present situation as it is or in a case where the user conducts the countermeasure presented by the manufacturer to the user by way of the network. Then, the charge described above is paid from the user to the manufacturer. It is possible to provide a method of producing the semiconductor device by repeating such steps. The countermeasure presented by the manufacturer can be performed by being down loaded as a file by the user and written into or adding to the program of the device. Depending on the situation, it is also possible for the manufacturer to cope with the situation while recognizing the state of the user's device by a diagnosis program through the network.

Further, it is also possible to estimate the processing characteristics under various processing conditions or different combined processing conditions using a correlation function based on simulation verified by actually measured data, as the database owned by the manufacturer.

It is further possible to visualize the characteristics estimated by the correlation function in moving pictures such as animation with the processing conditions being on the time axis or in display under emphasis, thereby enhancing the impression to the user and conducting checking of the process abnormality or start-up of an unknown processing condition rapidly and efficiently.

(Embodiment 3)

Figure 3:
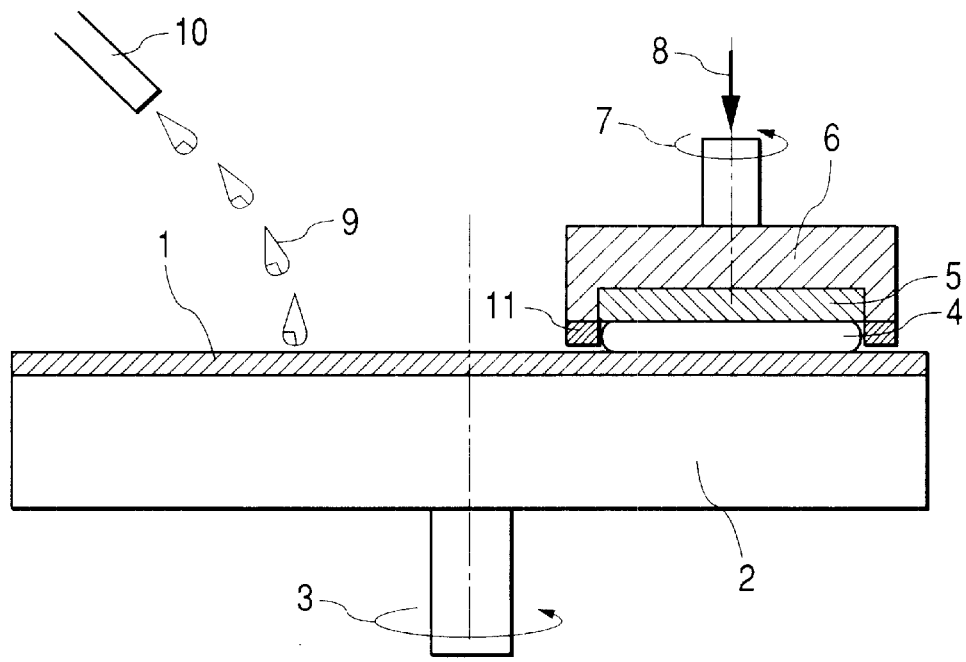
FIG. 3 is a schematic cross sectional view of a chemical mechanical polishing device used in a third embodiment according to this invention.

A chemical mechanical polishing step for a wafer flattening step of a substrate used for a semiconductor device is to be explained as a third embodiment according to this invention. FIG. 3 is a schematic cross sectional view for a chemical mechanical polishing device. A polishing pad 1 is appended as a polishing member on a rotational disk 2 and rotated in the direction of an arrow 3. The polishing pad is formed, for example, by slicing a foamed urethane resin into a thin sheet and is used while selecting the material and the fine surface structure variously depending on the kind of the work and the extent of the surface roughness to be finished. A wafer 4 as the work is secured by way of a diaphragm 5 to a holder 6. When a load is applied in the direction of an arrow 8 while rotating the holder 6 in the direction of an arrow 7 and, further, the pressure of fluid in the diaphragm is properly controlled, the surface of the wafer 4 is brought into contact with the surface of the polishing pad 1. During polishing, convex portions of the thin film on the surface of the wafer are polished and removed for flattening by supplying a polishing slurry 9 by a predetermined amount from a pipeline 10 to the polishing pad 1. When an insulation film such as made of silicon dioxide ($SiO_2$) is polished, colloidal silica formed by suspending fine silica particles into an aqueous solution of an alkali such as potassium hydroxide is generally used as the polishing slurry. Since alkali chemical action is applied, higher working efficiency is obtained compared with mechanical polishing using only abrasive grains. A retainer ring 11 is disposed to the outer periphery of the holder 6 for preventing the wafer 4 from detaching in the direction parallel with the polishing pad surface below the diaphragm 5 by the frictional force when the wafer 4 is polished being in contact with the polishing pad 1. The inner diameter of the retainer ring 11 is designed to a size somewhat greater than the outer diameter of the wafer 4. It is desirable to use a material such as a resin, for example, polyacetal in a case where polishing is conducted by a method of bringing the lower surface of the retainer ring 11 in contact with the surface of the polishing pad, or a hard material such as stainless steel when polishing is conducted by a method not in contact with the surface of the polishing pad.

Instead of the polishing pad described above, a fixed abrasive grain disk or a grindstone controlled to an optimum hardness can also be used. A smoothed surface with less processing damage can be obtained with a high flattening performance and working efficiency with no occurrence of scratches by using a grindstone formed by kneading abrasive grains such as of silicon dioxide, cerium oxide or aluminum oxide having a hardness of 5000 kg/mm$^2$ or more of modulus of elasticity and a grain size of about 0.01 to 1 $\mu$m with a high purity organic resin such as phenol or polyester and compacting them under an appropriate pressure and, optionally, bonding the same by a treatment such as heat setting.

Figure 4:
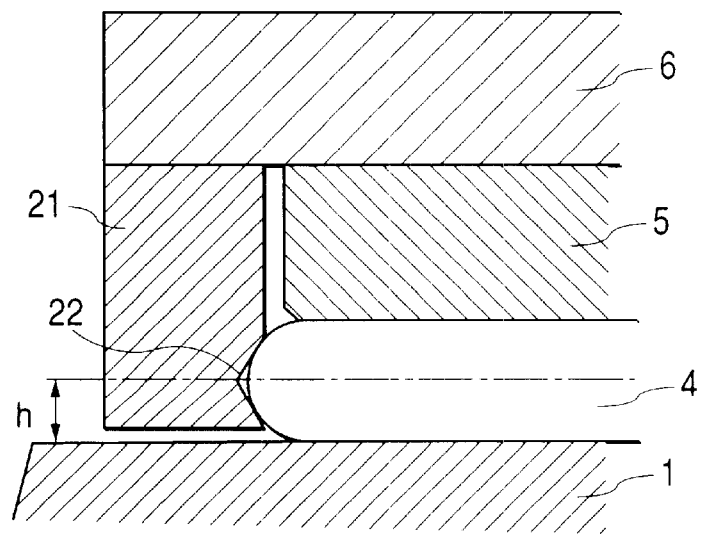
FIG. 4 is an enlarged fragmentary cross sectional view of a chemical mechanical polishing device used in the third embodiment according to this invention.

An example in a processing step using a fixed abrasive grain disk as the polishing member is explained to a case of changing the condition for the retainer ring. FIG. 4 is a schematic view showing an enlarged fragmentary side elevational cross section of a chemical mechanical polishing device having a retainer ring 21 with a groove 22 for controlling the height of the outer peripheral edge of the wafer 4. The retainer ring 21 is secured to the outermost periphery of the holder 6. The wafer 4 is pressed by way of the diaphragm 5 by the holder 6 to the polishing pad 1. By controlling the inner pressure of the diaphragm 5 and the load applied to the holder 6, the distance between the center of the groove 22 and the surface of the fixed abrasive grain disk 1, that is, the central height h of the wafer supported by the retainer ring can be set to a predetermined value. As a result, the working efficiency for the outer peripheral edge of the wafer 4 upon polishing can be controlled, and the distribution of the polishing rate within the plane of the wafer, that is, the wafer in-plane distribution after the processing can be controlled.

Figure 5A:
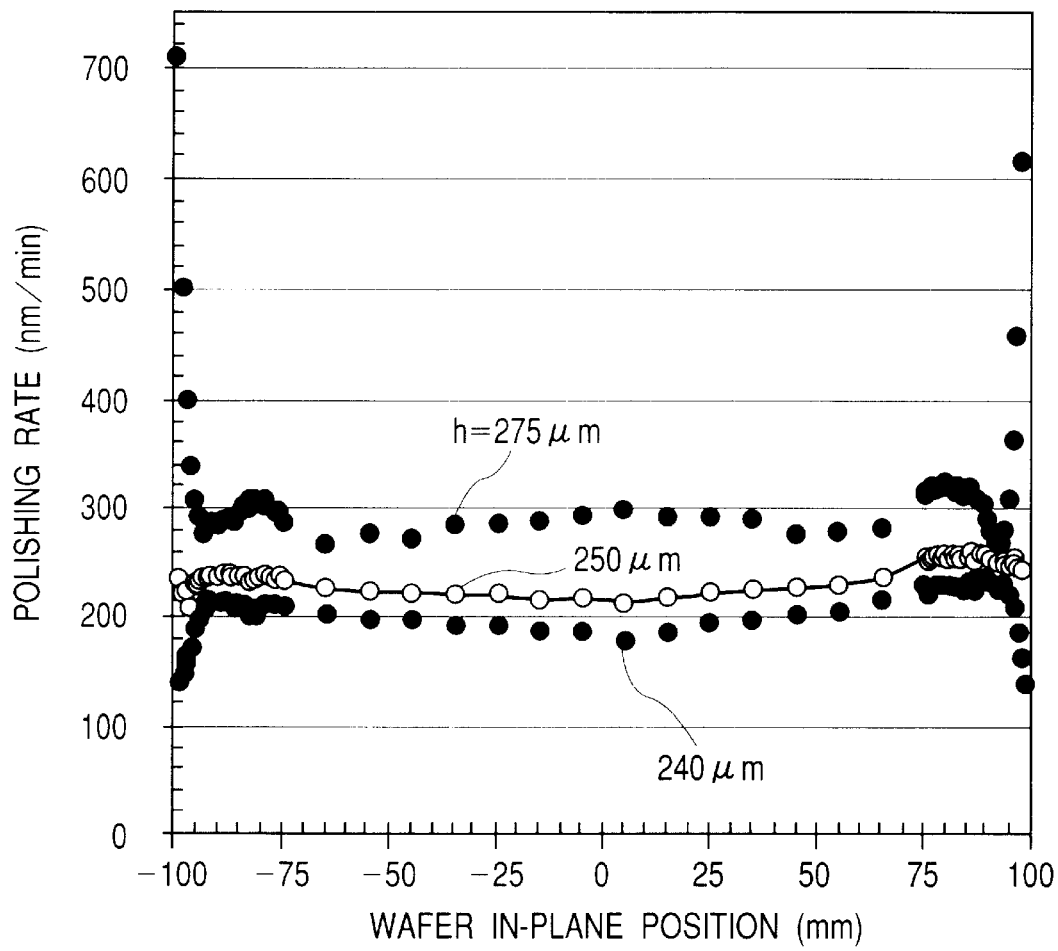
FIGS. 5($a$) and 5($b$) are graphs showing the distribution of a polishing rate and changing characteristics in the third embodiment according to this invention.
Figure 5B:
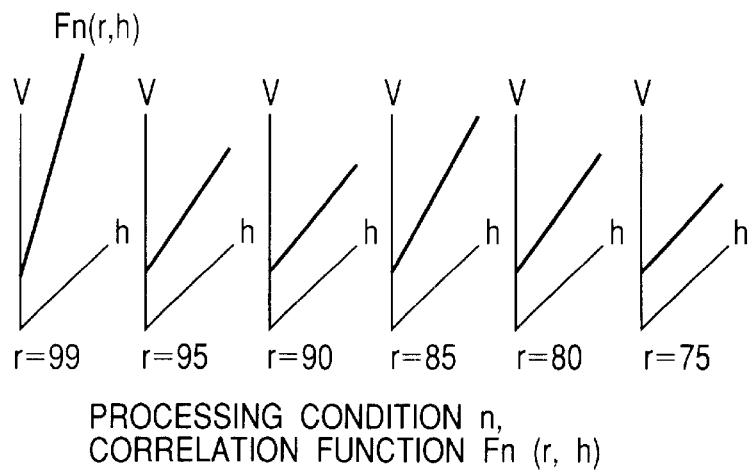
Figure 6A:
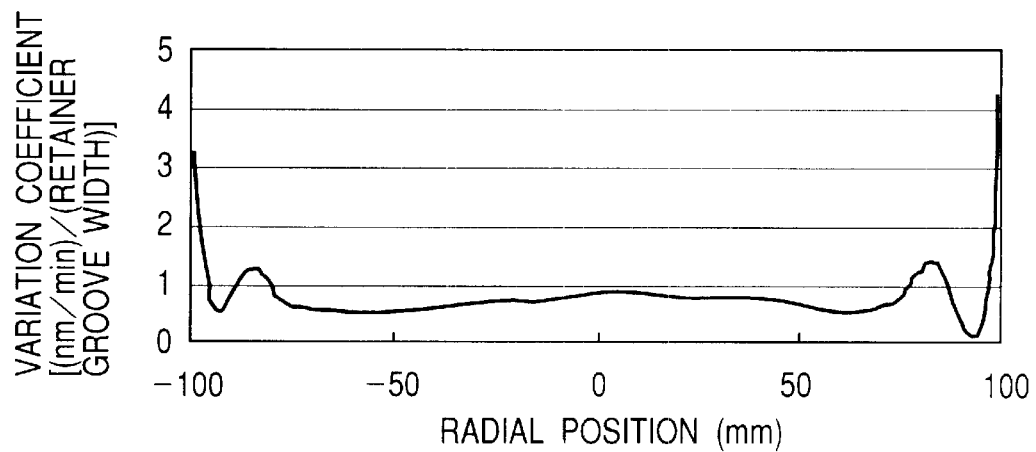
FIGS. 6($a$) and 6($b$) are graphs showing a correlation function and uniformness of the polishing rate in the third embodiment according to this invention.

FIG. 5(a) shows the distribution of the polishing rate to the wafer in-plain position. Solid circles show the result of measurement at the center height of the wafer supported by the retainer ring: h=275 $\mu$m and 240 $\mu$m. The thickness of the residual thin film on the surface of the wafer is measured by an optical film thickness gauge and the polishing rate is calculated based on the difference of the film thickness before and after the polishing and the processing time. The film thickness is determined by measuring at a predetermined distance along the diameter of a wafer of 200 mm diameter. As measuring distance, thickness was measured and the result was indicated at an interval of 1 mm for the area from the outer periphery to 25 mm inside of the wafer where the rate tends to change relatively abruptly and at an interval of 5 mm distance for a central area where the change is relatively moderate. FIG. 5(b) is a graph for an example of showing the changing characteristics by changing the polishing conditions to a wafer in-plane position selectively for the case where the wafer in-plane position r is from 99 to 75 mm in which the abscissas shows a distance h and the ordinate shows a polishing rate V. A correlation function Fn(r, h) can be determined on the measured data for the polishing rate V at the in-plane position r for the processing condition n of the polishing condition. In view of the correlation function Fn(r, h), polishing rate V for arbitrary h to the in-plane position r (=Fn(r, h)) can be calculated. The solid line in FIG. 5(a) is an estimated characteristic curve for the calculated polishing rate for h=250 $\mu$m, that is, in-plane distribution characteristics, from which it is estimated that abrupt change of the polishing characteristics for the outer periphery of the wafer is decreased at the distance: h=250 $\mu$m. Further, blank circles represent actually measured data for h=250 $\mu$m and it is recognized that the data well agrees with the estimated characteristic curve. FIG. 6(a) shows the variation coefficient of the correlation function for the in-plane position shown in FIG. 5(b) relative to the radial position as the in-plane position. This is an example of a pattern for the correlation function for the processing condition h.

Figure 6B:
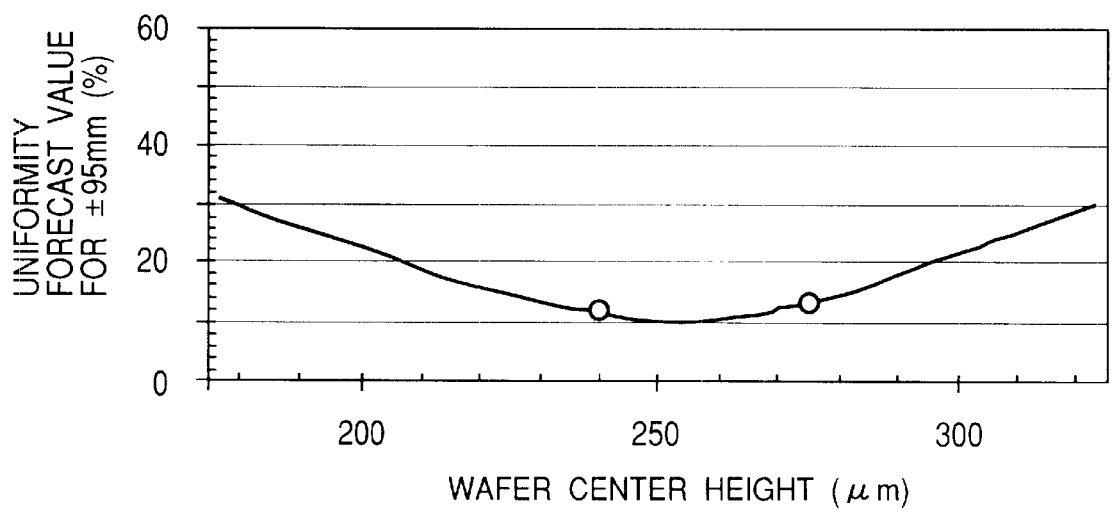

FIG. 6(b) is an example showing the characteristic curve for the uniformness of the polishing rate which can be calculated on the distance h between the center for the groove 22 of the retainer ring and the surface of the fixed abrasive grain disk, in other word, a distance between the center for the outer peripheral edge of the wafer and the polishing pad, that is, the in-plane distribution characteristics for the center height h of the wafer supported by the retainer ring by using the determined correlation function. The uniformness is a value determined by dividing the one-half amplitude of the change of the in-plane distribution within 95 mm radius of the wafer with an average processing rate. It can be estimated that the uniformness is minimum and most favorable when the measured center height of the wafer supported by the retainer ring is 250 $\mu$m. Blank circles in the graph show uniformness data in the in-plane distribution data for the center height: h=240 $\mu$m and h=275 $\mu$m in the wafer supported by the retainer ring. By using the estimated characteristics of the correlation function according to this invention, there is recognized a feature capable of easily forecasting the characteristics regarding the uniformness which forms a secondary or higher order of characteristic curve on the two condition data. Since the in-plane distribution characteristics for any arbitrary processing condition can be determined in view of the correlation function for the processing condition, a feature capable of easily estimating the conditions for optimizing the uniformness in a desired region and an allowable range can be recognized. The wafer used herein has a thickness of 750 $\mu$m with the center at 375 $\mu$m. Accordingly, the center height: h=250 $\mu$m of the wafer supported by the retainer ring means that the polishing is conducted in a state of applying a load to enforce by about 100 $\mu$m to the surface of the mixed abrasive grain disk. Uniformness within a predetermined radius is calculated by dividing the one-half for the maximum value and the minimum value in the radius of the polishing rate distribution curve within the plane with an average processing rate. Further, the average processing rate is calculated by dividing the sum of a product between the abrasive rate value and the radius value at each radius in a predetermined region by the sum of the radial values. That is, (uniformness)=(Vmax−Vmin)/2)/vav and, further, Vav=$\Sigma$(Vn×Rn)/$\Sigma$(Rn). Vmax is a maximum working rate value, Vmin is a minimum polishing rate, Vav is an average polishing rate, Rn is a radius value and Vn is a polishing rate value at radius Rn. In a case of determining an average polishing rate by using the in-plane distribution data for the poloshing rate, calculation weighted to the radial position is desirable. Particular, it is effective to a case of optionally changing the gradient of the radial position as in this embodiment.

The variation coefficient in FIG. 6(a) is an increasing function regarding the wafer center height h, that is, retainer groove width (=2h) and the polishing rate tends to increase as the center height h of the retainer ring supported wafer is larger. In addition, it shows a non-linear pattern where increment is greatly different depending on the radial position. This is considered to be attributable to that a polishing slurry tends to intrude easily to the boundary where the surface of the wafer and the surface of the polishing pad are in press contact with each other and the extent thereof changes abruptly depending on the radial position.

(Embodiment 4)

Figure 7:
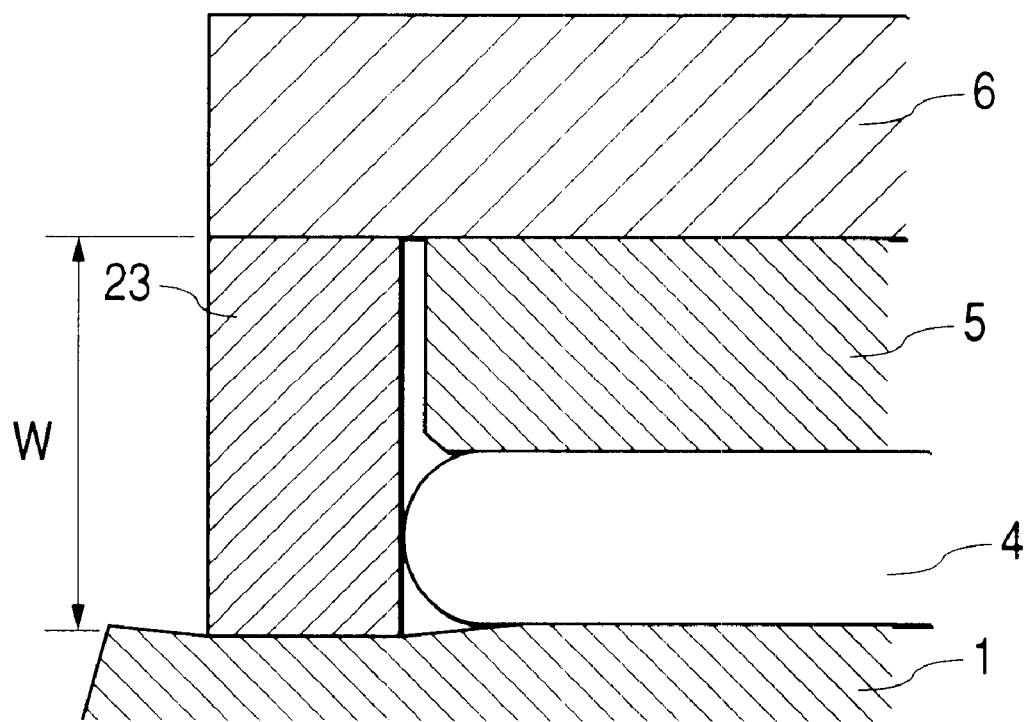
FIG. 7 is an enlarged fragmentary cross sectional view of a chemical mechanical polishing device used in a fourth embodiment according to this invention.

A chemical mechanical polishing step using a soft and flexible abrasive cloth as a polishing member for the wafer flattening step of a substrate for use in a semiconductor device is to be explained as a fourth embodiment according to this invention. FIG. 7 is a schematic view illustrating an enlarged fragmentary side elevational cross section of a chemical mechanical polishing device having a cylindrical retainer ring 23 with a vertical inner wall for preventing wafer 4 from detaching in a horizontal direction. The retainer ring 23 of a thickness W is fixed to the outermost periphery of a holder 6. A wafer 4 is pressed by way of a diaphragm 5 by the holder to a polishing pad 1. By controlling the inner pressure of the diaphragm 5 and a load applied to the holder 6, the retainer ring 23 is brought into contact with a polishing pad surface and the polishing rate for the wafer outer periphery is adjusted by controlling the force applied by way of the wafer to the polishing cloth and the force applied to the polishing cloth by way of the retainer ring. As an alternative method of controlling the inner pressure of the diaphragm and the load applied to the holder 6, it is possible to vary the thickness W of the retainer ring 23. That is, as the thickness W increases, the force applied from the retainer ring 23 to the abrasive cloth increases.

Figure 8A:
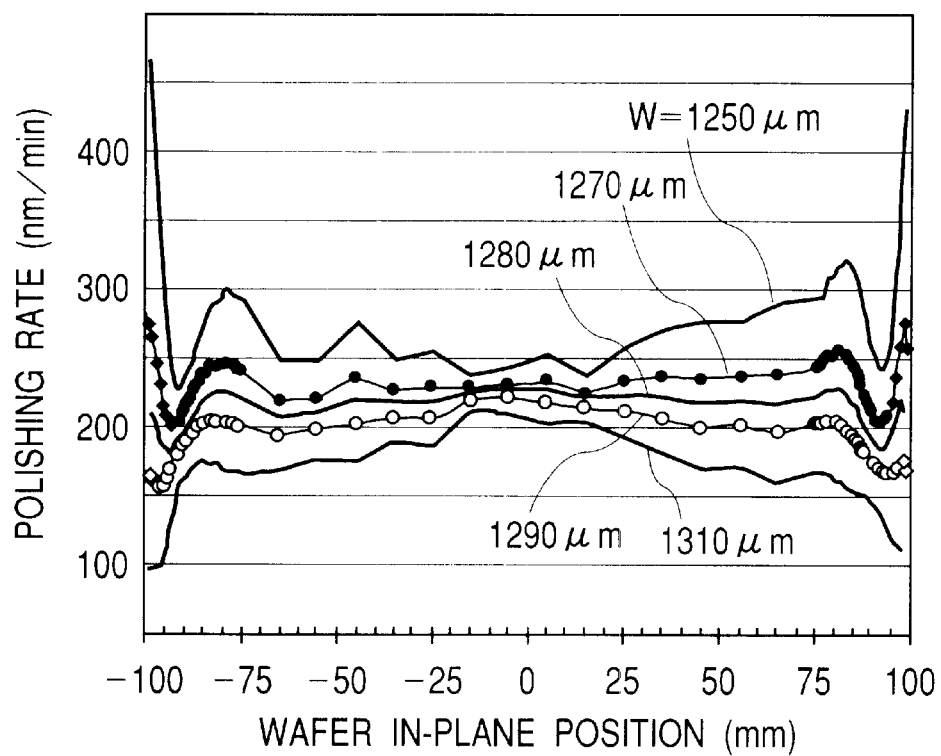
FIGS. 8($a$) and 8($b$) are graphs showing the distribution of the polishing rate and changing characteristics in the fourth embodiment according to this invention.
Figure 8B:
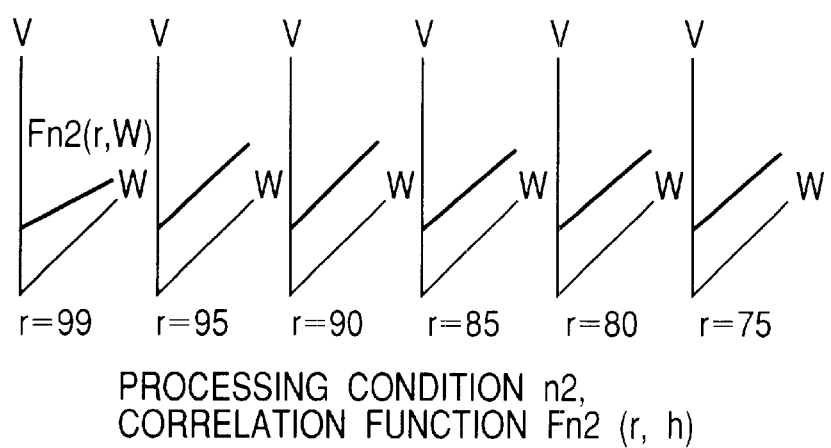
Figure 9A:
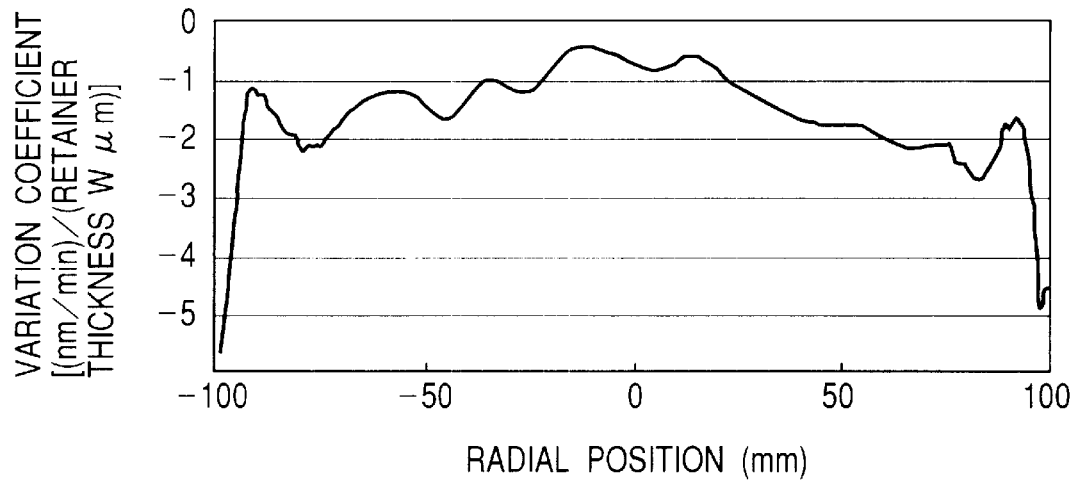
FIGS. 9($a$) and 9($b$) are graphs showing a correlation function and uniformness of the polishing rate in the fourth embodiment according to this invention.

FIG. 8(a) shows the distribution of the polishing rate to the wafer in-plane position. Black circles show the result of measurement at the retainer ring thickness W=1270 $\mu$m and blank circles show the result of measurement at the retainer rings W=1290 $\mu$m. The thickness of the residual thin film on the wafer surface is measured by an optical film thickness gage to calculate a polishing rate based on the amount of difference of the film thickness before and after polishing and the processing time. The film thickness is determined by measuring along the wafer at a predetermined distance of a wafer having 200 mm diameter. As the measuring distance, measurement was made at 1 mm distance for an area from the outer periphery to 25 mm inside of the wafer where the rate tends to change relatively abruptly and at 5 mm distance for a central area where the change is relatively moderate and the result was shown by a linear curve connecting each of the data. FIG. 8(b) is a graph as an example of showing changing characteristics by changing the polishing condition to the wafer in-plane positions, selected in a case of 99 to 75 mm for the wafer in-plane position r in which the abscissa indicates the thickness W and the ordinate indicates the polishing rate V. The correlation function Fn2(r, W) can be determined on the measuring data for the polishing rate V at the in-plane position r using the polishing condition as the polishing condition n2. The polishing rate V (=Fn2(r, W)) can be calculated at an arbitrary thickness W to the in-plane position r in view of the correlation function Fn2(r, W). The characteristic curve at W=1250, 1280 and 1310 $\mu$m shown by a solid line in FIG. 8(a) is an in-plane distribution characteristic of the polishing rate determined in this way, in which abrupt changing range of the polishing rate for the wafer outer circumference is forecasted to be minimum. FIG. 9(a) shows the variation coefficient of the correlation function for the in-plane position as shown in FIG. 8-b to the radial position as the in-plane position. This is an example of the pattern for the correlation function for the processing condition n2.

Figure 9B:
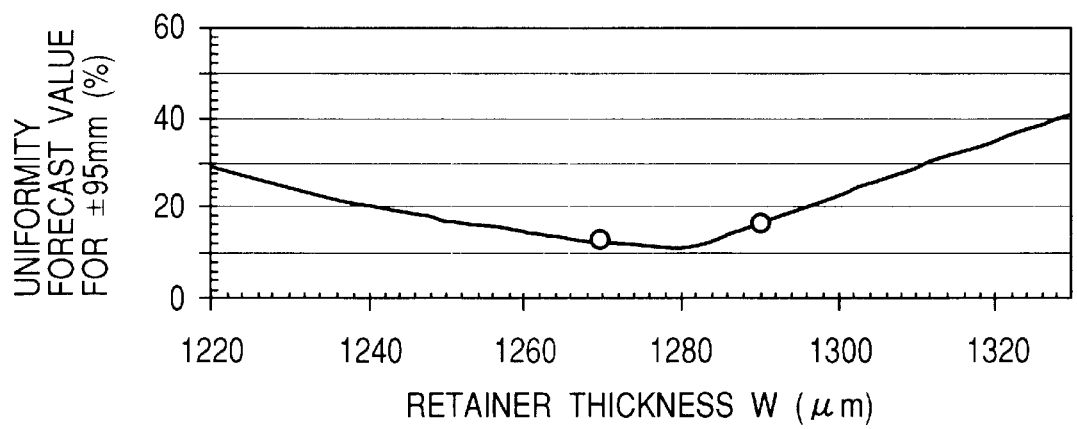

FIG. 9(b) is an example for the result of calculating the uniformness of the polishing rate to the retainer ring thickness W by using the determined correlation function Fn2(r, W). This is a value determined by dividing the one-half amplitude for the change of the in-plane distribution within the radius of 95 mm with an average working rate. It can be estimated that the uniformness is best at the retainer ring thickness W of 1280 $\mu$m. Further, blank circles in the graph show uniformness data for the measured two in-plane distribution data. By using the in-plane distribution characteristics determined in view of the correlation function according to this invention, it is also recognized a feature capable of forecasting the uniformness characteristics in view of the in-plane distribution characteristics as a secondary or higher order characteristic curve based on the two condition data.

The variation coefficient of the FIG. 9(a) shows a trend that the polishing rate decreases as the retainer thickness W increases. This is considered to be attributable to that the wafer tends to rise by a liquid present at the boundary between the wafer and the polishing pad and the surface of the wafer tends to be detached from the surface of the polishing pad along with increase in the retainer thickness and, accordingly, the polishing rate decreases.

As apparent from comparison of the pattern between FIG. 6(a) and FIG. 9(a), the pattern for the variation coefficient of the correlation function differs depending on the processing condition and the feature of this invention that the processing situation can be recognized with a high accuracy by accumulating the same as a database.

(Embodiment 5)

Figure 10A:
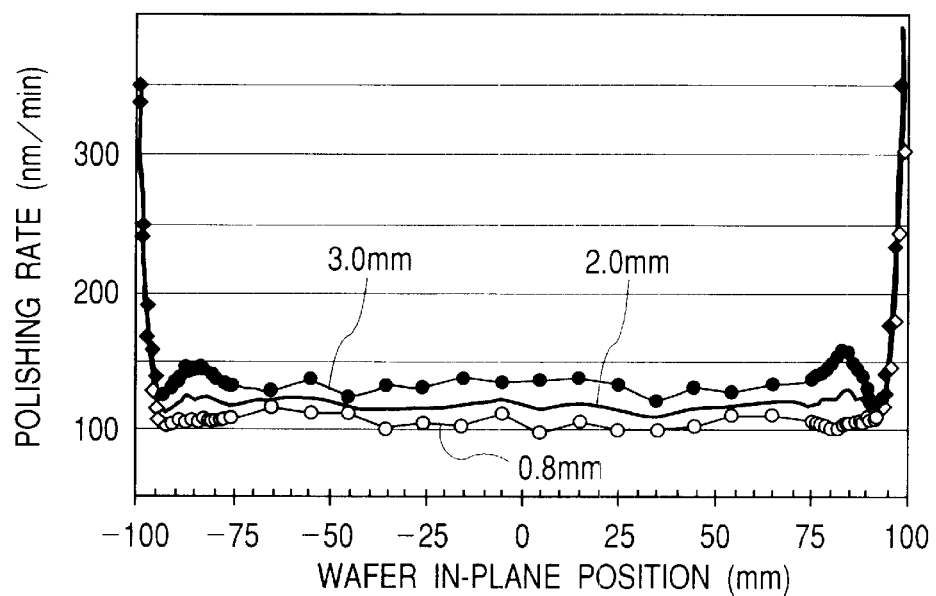
FIGS. 10($a$) and 10($b$) are graphs showing a distribution of the polishing rate and a correlation function in a fifth embodiment according to this invention.
Figure 10B:
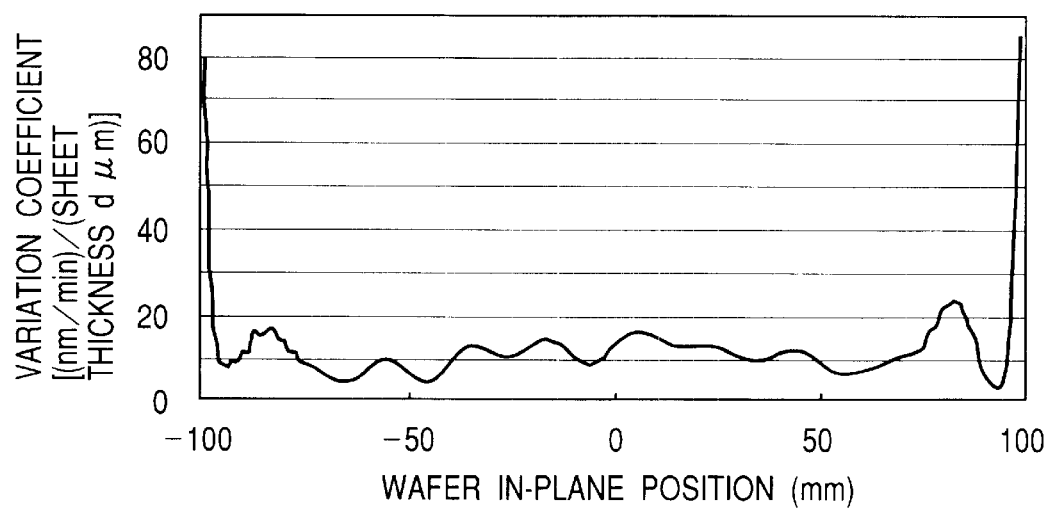
Figure 11:
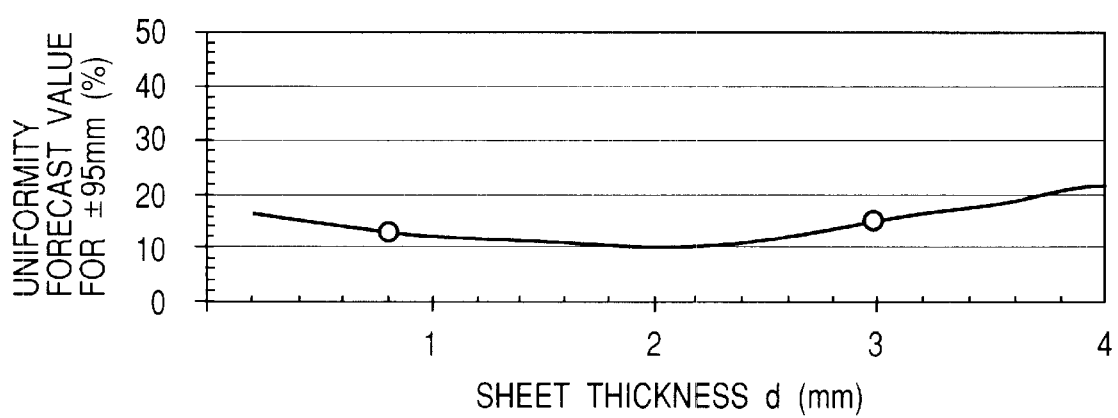
FIG. 11 is a graph showing uniformness of the polishing rate in the fifth embodiment according to this invention.

A chemical mechanical polishing step for a wafer flattening step of a substrate used for a semiconductor device is to be explained as a fifth embodiment according to this invention. FIG. 10(a) shows the distribution of polishing rate to the wafer in-plane position when polishing is applied while varying the thickness of the diaphragm sheet that presses the back of the wafer to a fixed abrasive grain disk of the polishing means as the processing condition. Solid circles show the result of measurement at the sheet thickness: d=3.0 mm and blank circles show that at the sheet thickness: d=0.8 mm. FIG. 10(b) is an example of a pattern of a correlation function with the thickness of the diaphragm sheet being as the processing condition. FIG. 11 is an example of the result for calculating the uniformness of the polishing rate to the thickness d of the diaphragm sheet determined by using the correlation function. The uniformness is best at the sheet thickness: d=2 mm and the distribution of polishing rate in the wafer plane is shown by a solid line in FIG. 10(a). By the use of the in-plane distribution characteristics determined by the correlation function of this invention, the uniformness characteristics can be forecast based on the two conditions in view of the in-plane distribution characteristics, that is, secondary or higher order of the characteristic curve relative to the sheet thickness d of the diaphragm, that is, an optimum sheet thickness can be determined on the measuring data for different sheet thickness of 0.8 mm and 3 mm. As described above, this invention provides a feature capable of determining a principal dimension of a chemical mechanical polishing device in view of few number of measuring data.

(Embodiment 6)

A chemical mechanical polishing step for a wafer flattening step of a substrate used for a semiconductor device is to be explained as a sixth embodiment according to this invention. A fixed abrasive disk was used as a polishing means.

Figure 12A:
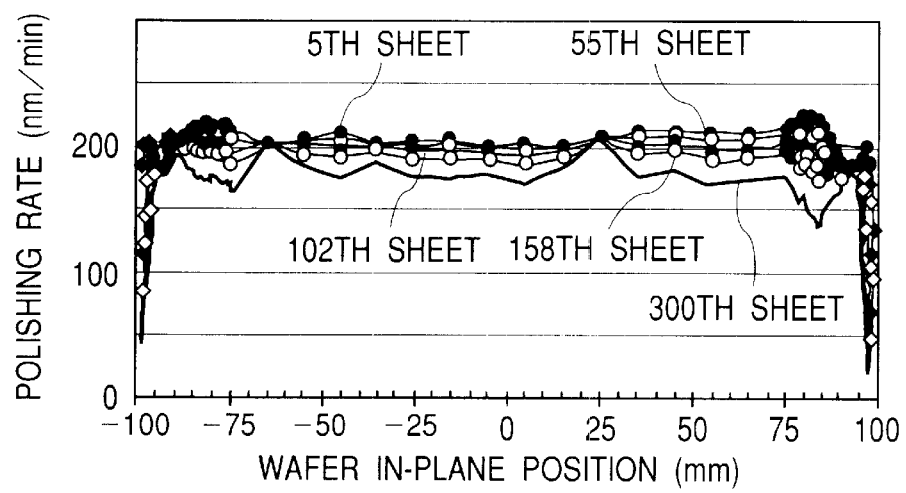
FIGS. 12($a$) and 12($b$) are graphs showing the distribution of the polishing rate and changing characteristics in a sixth embodiment according to this invention.
Figure 12B:
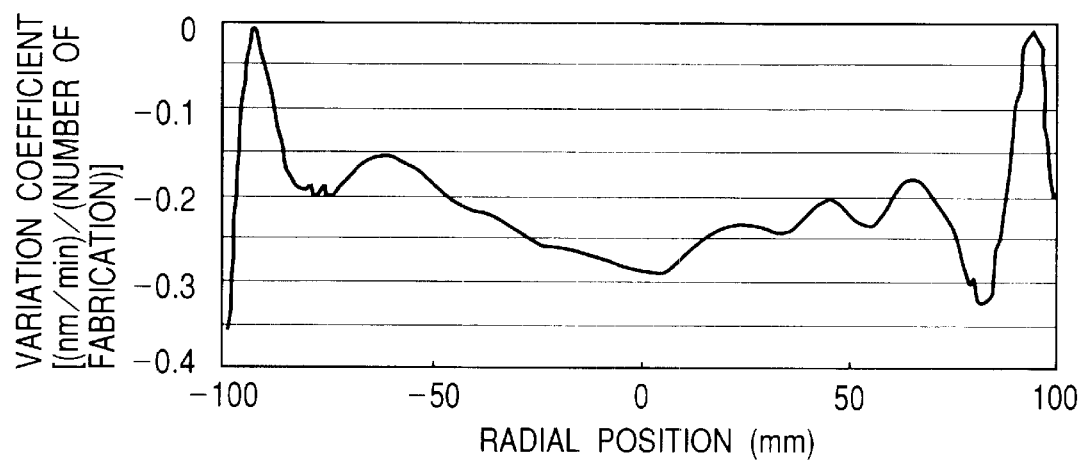

FIG. 12(a) shows the distribution of polishing rate to the wafer in-plane position, the number of sheets to be polished being as the processing condition. That is, it shows the so-called aging change of the polishing step. The result of measurement is shown by solid circles for 5th sheets and 102th sheet and by blank circles for 55th sheet and 158th sheet. FIG. 12 (b) is an example of a pattern for the correlation function for the number of polished sheets, that is, to the aging change. FIG. 13 is an example for the result of calculating the aging change of the uniformness, that is, accumulation corresponding number in view of the in-plane distribution characteristics of polishing rate determined by using the correlation function using data for four processing conditions at 5th, 55th, 102th and 158th sheet. Blank circles show the uniformness value measured under four conditions measuring the in-plane working rate distribution. It can be estimated that the optimal uniformness point is about at 150th sheet and the uniformness gradually lowers after passing the optimal point. For the allowable range of ±15% of the uniformness, it shows that 300 sheets can be processed with no adjustment.

Figure 23A:
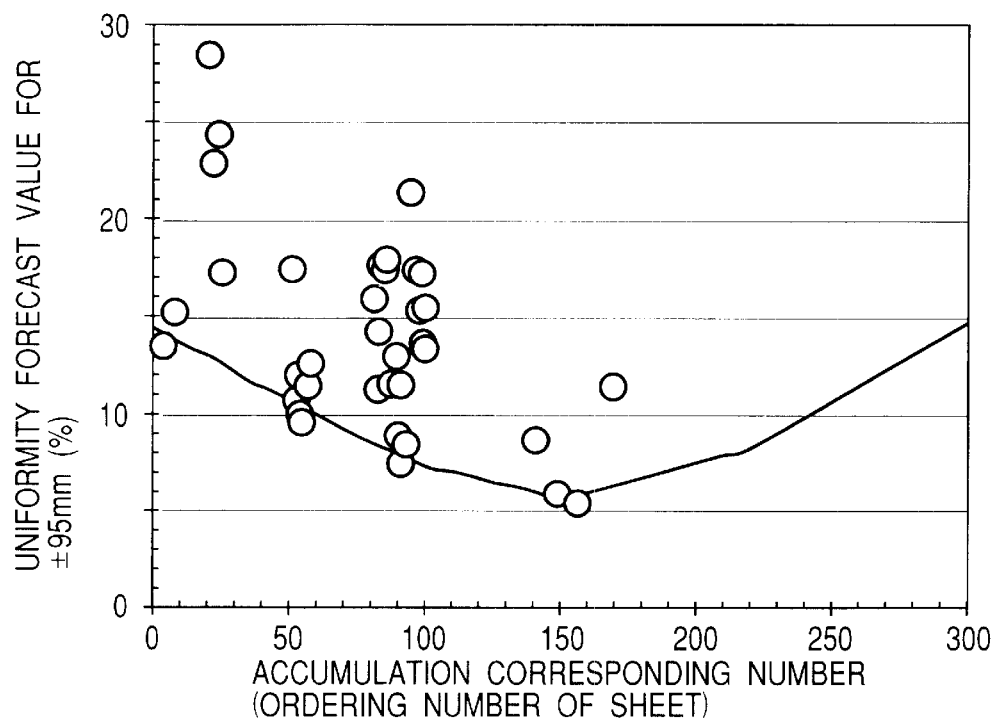
FIGS. 23(a) and 23(b) are graphs showing the aging change of the uniformness for the polishing rate in the sixth embodiment according to this invention.
Figure 23B:
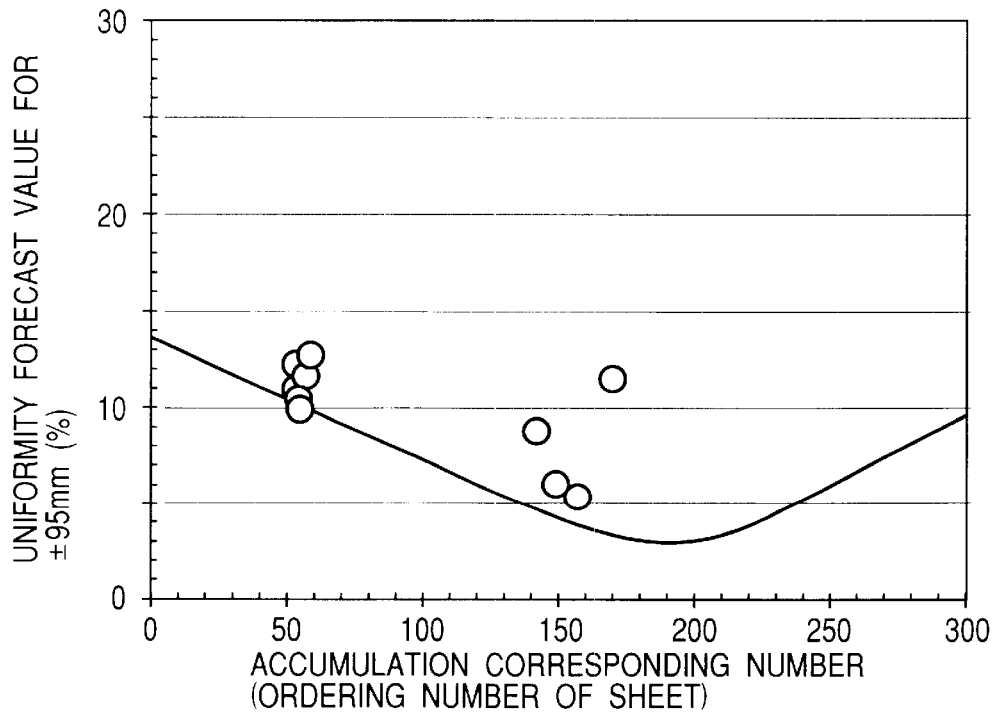

Accordingly, it is possible to indicate the countermeasure such as adjustment for the holder at the processing number of the 300th sheet. Four processing condition data were used for forecasting the uniformness in FIG. 13. On the contrary, FIG. 23(a) shows the forecast characteristics of the uniformness calculated in view of the in-plane distribution characteristic of the polishing rate determined by the correlation function on 35 samples data in addition to the four processing conditions and FIG. 23(b) shows the forecast characteristics of the uniformness calculated in view of the in-plane distribution characteristic of the polishing rate determined by the correlation function on 10 data near the 50 sheet and near the 160 sheet. Blank circles in each of the graphs show the uniformness value for the actually measured individual distribution for the polishing rate and it is observed that the value varies with a considerable range. The uniformness value varies for the individual data because the fluctuation factor other than the processing conditions mentioned here actually gives an effect.

However, this invention can provide a feature that the forecast value shows substantially identical characteristics irrespective of the number of data to be handled by determining the correlationship at the step of the distribution data of polishing rate, estimating the in-plane distribution characteristic of the polishing data to the accumulation corresponding number of sheets and forecasting the uniformness based thereon.

Figure 24A:
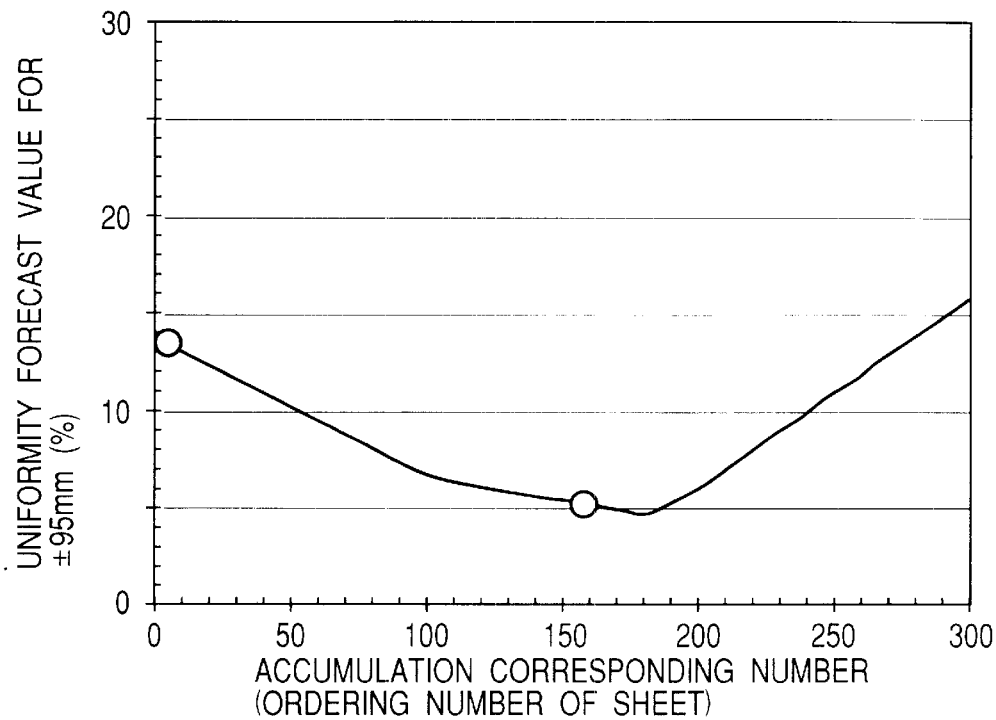
FIGS. 24(a) and 24(b) are graphs showing the aging change of the uniformness for the polishing rate in the sixth embodiment according to this invention.
Figure 24B:
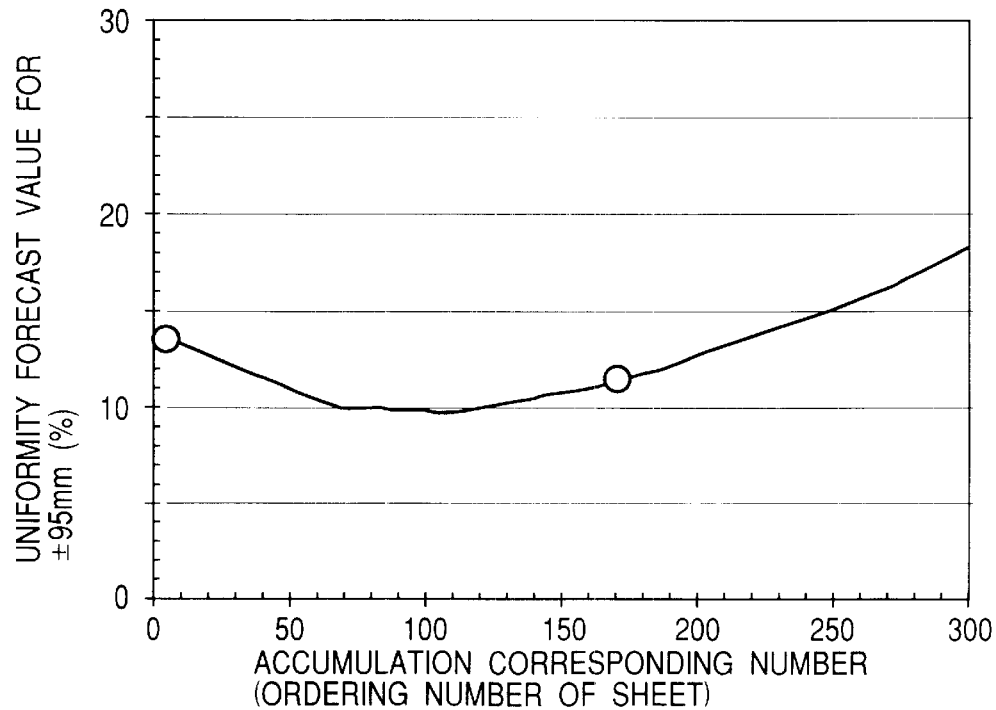

However, in a case where polishing rate distribution data varies greatly, the forecasting accuracy of the characteristics can be improved by using a number of data. FIG. 24(a) shows the forecasting characteristics of the uniformness calculated in view of the in-plane distribution characteristics of the polishing rate determined by the correlation function on two data with less effects of error factors other than the processing conditions and FIG. 24(b) shows the forecasting characteristics of the uniformness calculated from the in-plane distribution characteristics of the polishing rate determined by the correlation function on two data including the data having large effect of the error factor other than the processing condition. While the forecasted characteristics of FIG. 24(a) substantially agree with the result of FIG. 13 or FIG. 23, the forecasted characteristics of FIG. 24(b) differ greatly. This is because change of the polishing characteristic distribution caused by the factors other than the aging change to be considered here gives a significant change on the second data, which should be noted in a case where the number of data used is few. Accordingly, it is desirable to use a plurality of distribution data at the processing condition in a case of the producing apparatus or process in which collected fluctuation factors are overlapped. However, since the result substantially identical with forecasting by the number of data of FIG. 23(a) can be obtained by the forecasting on the two data as shown in FIG. 24(a) in a case where other fluctuation factors can be separated, this invention can provide a feature capable of shortening labors for data processing and recognizing problems in view of the semiconductor producing apparatus or the semiconductor processing process extremely easily. Thus, this invention can provide a feature capable of presenting forecasting and warning as a countermeasure for the aging change of the chemical mechanical polishing device on few number of measuring data.

Processing conditions that can be considered in the embodiments described previously can include, for example, dressing condition for polishing means (for example, structure, shape, cutting depth, relative speed, number of rotation, load, scanning speed, scanning range, dressing frequency and times elapsed for the dresser tooth), conditions for polishing means (for example, number of rotation, amount of polishing liquid, concentration of polishing liquid, concentration of dispersant, material for polishing pad, fine groove structure of polishing means, material for grindstone, abrasive grain shape and times elapsed), holder conditions (for example, number of rotation, load, structure of diaphragm, material for diaphragm, way of appending the diaphragm, material and structure of diaphragm and member in contact with the rear face of the wafer, distribution and control method for the pressure in diaphragm, structure of retainer ring, inner or outer diameter size of the retainer ring, material for retainer ring, modulus of elasticity, frictional force during processing and times elapsed) and wafer condition (for example, diameter, thickness, rear face structure, rounded structure for the outermost periphery, pattern structure, material for insulation film, material for wiring, hysteresis of processing steps, frictional force during processing and cleaning method).

Further, this invention is applicable in addition to chemical mechanical polishing step, to semiconductor processes requiring in-plane uniformness of a substrate to be treated such as etching step, film deposition step, CVD (Chemical Vapor Deposition), spin coating step and plating step. Further, it is also developable to a system of estimating the process by combining the defect distribution data in the wafer plane or pattern size distribution data and processing conditions used for obtaining the same.

(Embodiment 7)

A chemical mechanical polishing step for a wafer flattening step of a substrate used for a semiconductor device is to be explained as a seventh embodiment according to this invention.

Figure 14A:
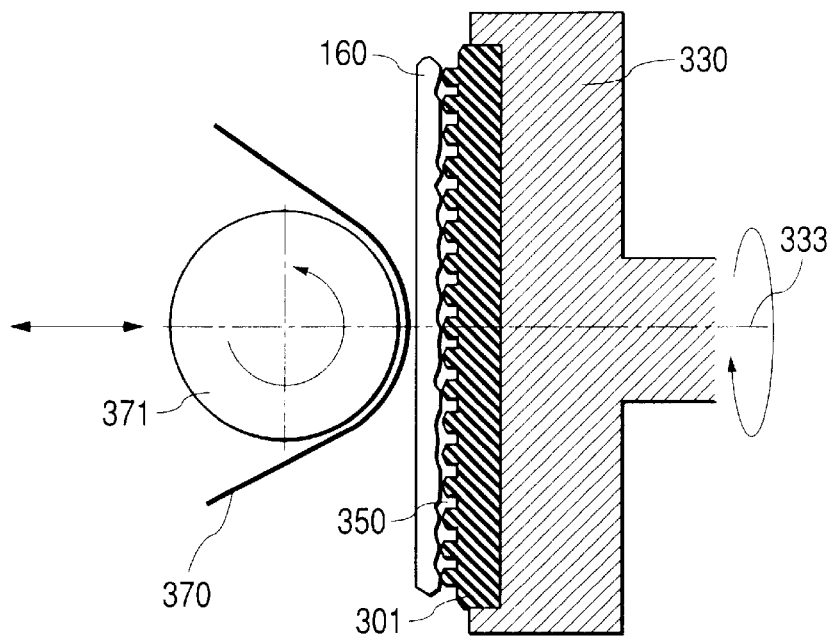
FIGS. 14($a$) and 14($b$) are respectively a schematic side elevational view and a front elevational view of a chemical mechanical polishing device in a seventh embodiment according to this invention.
Figure 14B:
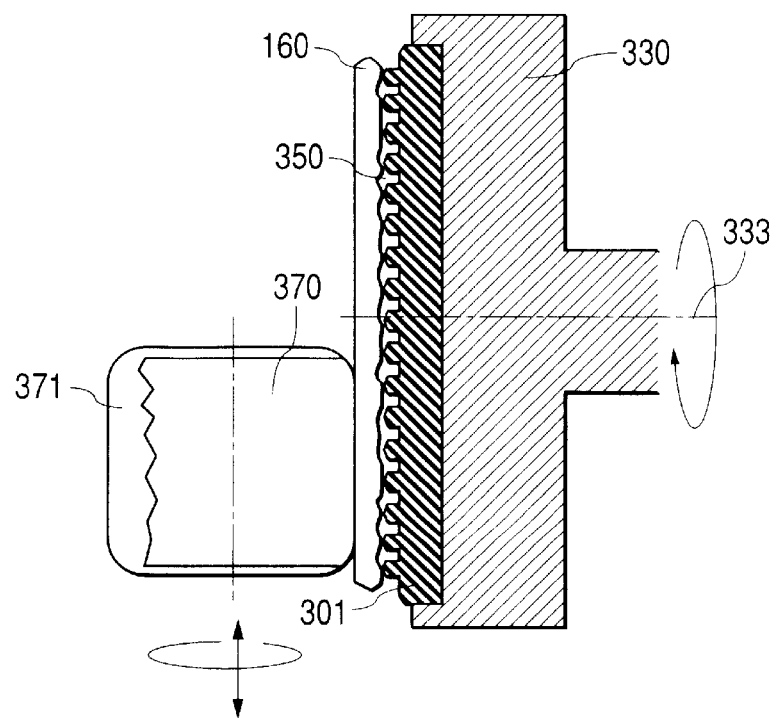

FIG. 14(a) is a schematic side elevational view of a chemical mechanical polishing device and FIG. 14(b) is a schematic front elevational view. It shows a method of producing a semiconductor device using a polishing tape 370 carrying abrasive grains as a polishing means. A wafer 160 is fixed by suction to a holder 301 placed on a attaching base 330 that can be rotated with a high accuracy. A fluidized medium 350 is supplied to a non-contact region between the protrusion or wall of the holder 301 and the substrate surface of the wafer 160, and the medium 350 filled in the gap is cooled to a predetermined temperature and solidified to increase the fixing/retaining force for the wafer 160. Since the poor flatness of the wafer surface can be compensated by the method, wafer can be fixed without conduction of the surface. Then, it is rotated around the shaft 333 as a center with a high accuracy. A polishing tape 370 is successively delivered and taken up at a predetermined speed under an appropriate tension by a not illustrated delivery/take-up mechanism. A processing load is applied to the wafer by a rotational roller 371 from the back of the polishing tape. By the use of the polishing tape, the dressing step of the polishing means can be simplified and a semiconductor device can be manufactured by a uniform and stable chemical mechanical polishing. Embodiments described previously and application thereof can be adopted also in the processing step using such a chemical mechanical polishing device.

(Embodiment 8)

Figure 19:
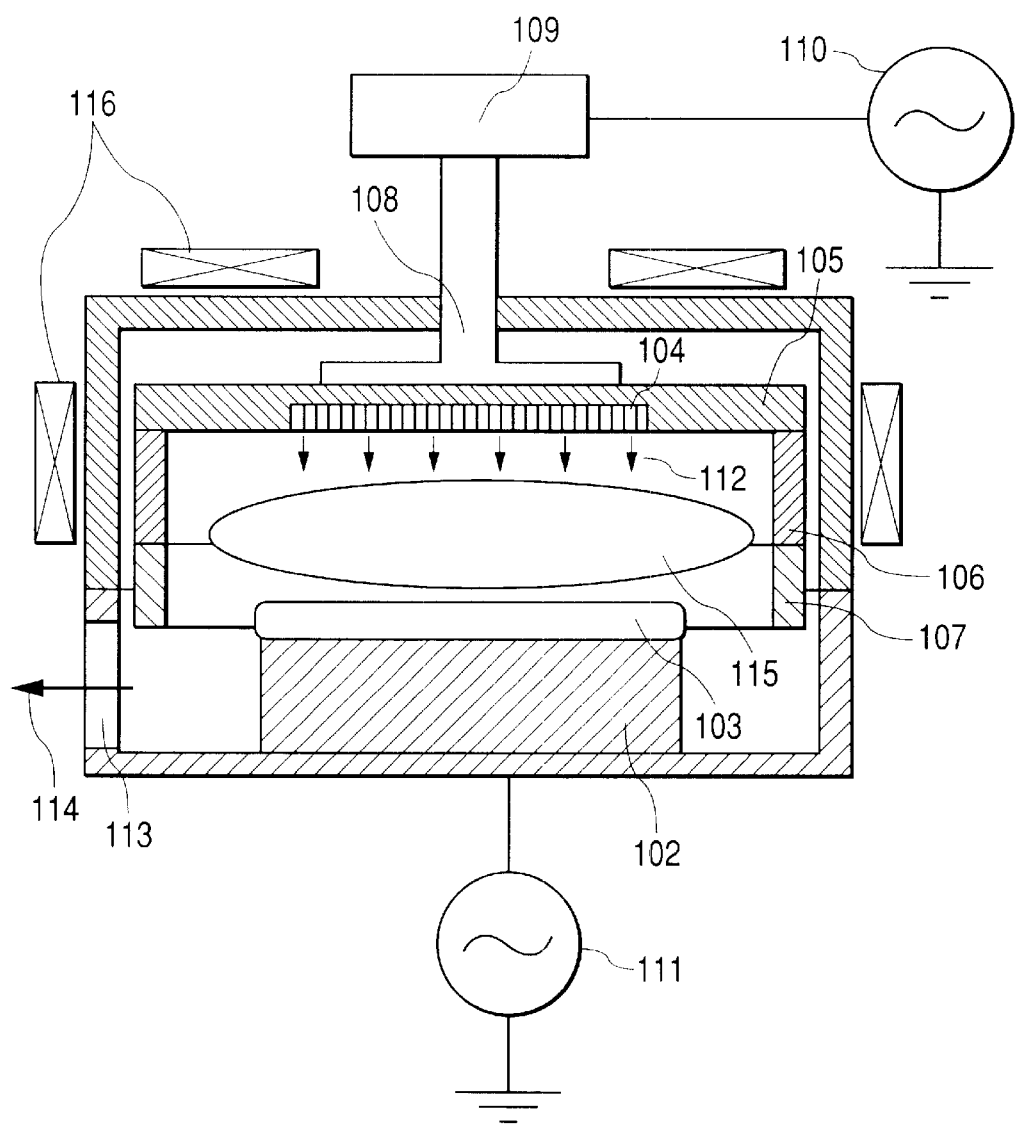
FIG. 19 is a schematic cross sectional view of an etching device in an eighth embodiment according to this invention.

As an eighth embodiment, etching step for a semiconductor device substrate is to be explained. FIG. 19 is a schematic cross sectional view of an etching device. The etching device has a quartz top plate 105 having a shower plate 105 for jetting out a processing gas and a quartz cylinder 106 of a structure surrounding a wafer 103 opposed to the wafer 103 on a specimen base 102 in a vacuum chamber. An antenna 180 is connected to the quartz top plate 105 and the antenna 180 is connected by way of an auto-tuner to a UHF power source 110. On the other hand, the specimen bed 102 is connected with an RF power source 111. After placing the wafer in the vacuum chamber, inside of the vacuum chamber is evacuated, a predetermined gas is supplied from a not illustrated gas supply system and a processing gas is jetted out from a plurality of holes in the shower plate 104 in the direction of an arrow 112, discharged from an exhaust port 113 in the direction of an arrow 114 to set a predetermined reduced pressure. When a predetermined voltage is applied to the UHF power source and the RF power source while flowing the processing gas, plasmas 115 are formed just above the surface of the wafer 103. A plurality of magnetic field coils 116 located at the outside are used for the control of density and distribution of the plasmas 115.

The etching characteristics for the wafer surface change depending on the state of the uniformness of the plasma 115. The state of the uniformness of the plasmas depend on the power and the frequency of the UHF power source for supplying main power and the RF power source for biasing respectively, processing gas composition, gas flow rate, gas flow distribution, diameter of the shower plate 104, distance between the antenna 108 and the wafer, shape such as inner diameter of the quartz cylinder 106 and the grounding 107, structure and coil currents for the magnetic field coil 116. Behavior such as reaction of active molecules or number of re-incidence of active molecules in the plasmas and reaction products are changed subtly by the factors described above. The etching speed, the etching speed distribution within the wafer plane and the directionality of etching also undergo the effect of such factors and the uniformness of the etching characteristics for the pattern on the wafer surface of a large diameter are changed. When the plasmas is not uniform, the shape of the fine pattern on the wafer formed by etching is deteriorated to lower the pattern size accuracy (CD: Critical Dimension). One of the methods for measuring the plasma uniformness can include a method of measuring an ion current density within the wafer plane.

Figure 20A:
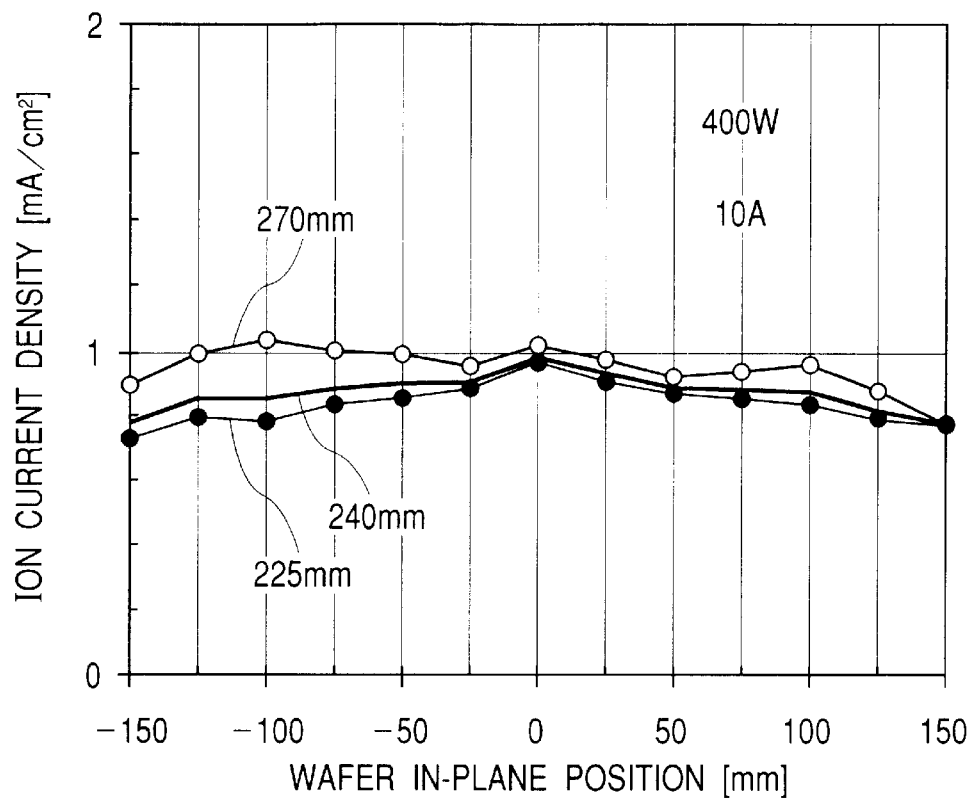
FIGS. 20($a$) and 29($b$) are graphs showing the distribution of an ion current density and the uniformness in the eighth embodiment according to this invention.
Figure 20B:
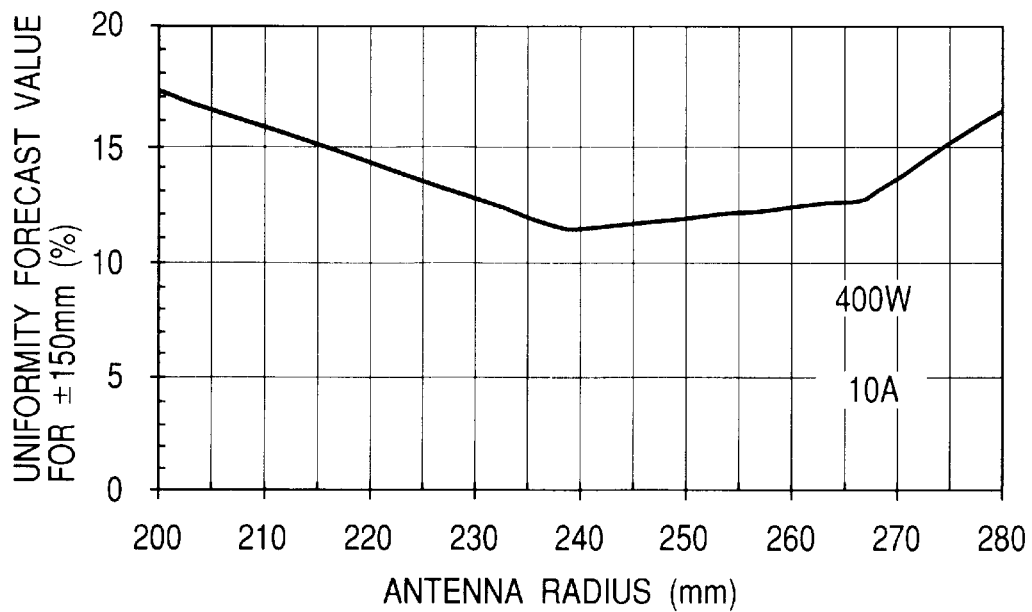

FIG. 20(a) shows the change of the uniformness of the plasmas depending on the shape of the antenna 108, that is, the diameter of the antenna as the processing condition by the ion current density. The result of measurement in a case of forming the plasmas at the UHF power of 400 W (450 MHz) and at a coil current 10 A are shown by solid circles for the antenna diameter at 225 mm and by blank circles for the antenna diameter of 270 mm. The ion current density at the position on the diameter of a wafer of 300 mm diameter was measured at 25 mm interval. FIG. 20(b) shows a result of calculating the in-plane distribution characteristics of the ion current density to the wafer in-plane position at an arbitrary antenna diameter, determining uniformness of the plasmas at ±150 mm relative to the wafer center on the diameter and drawing the same relative to the antenna diameter. A feature that the uniformness reaches a minimum value of 11.5% at the antenna diameter of 240 mm is recognized. FIG. 20(a) shows by a solid line the ion current density distribution of plasmas at the antenna diameter of 240 mm in which the uniformness reaches minimum.

Figure 21A:
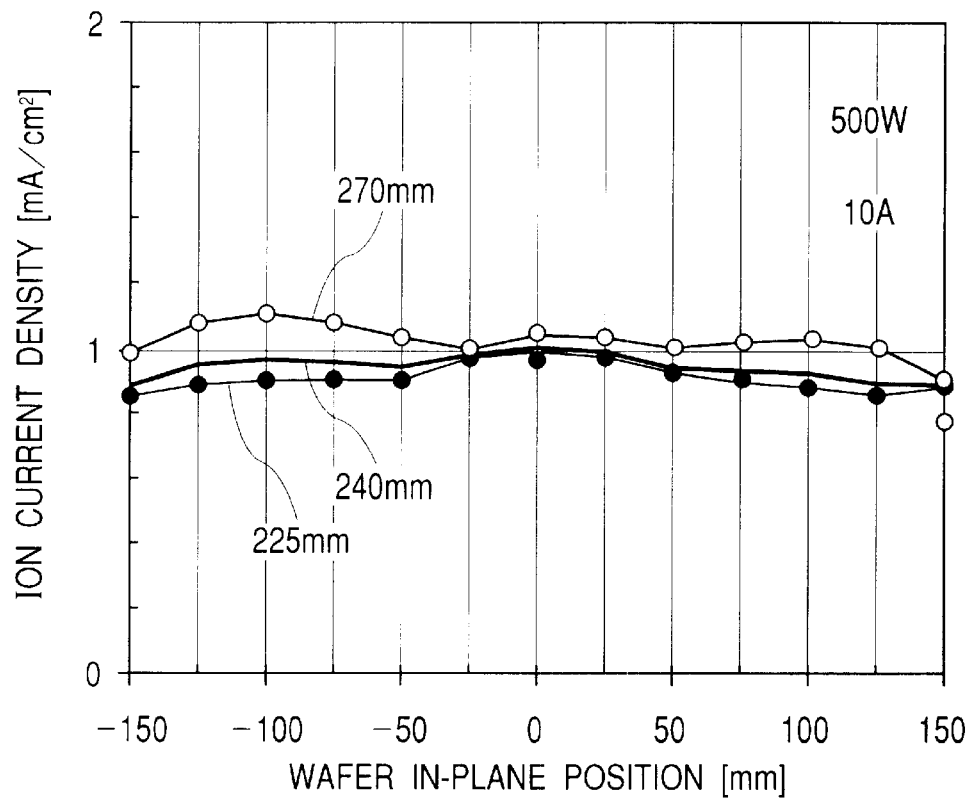
FIGS. 21($a$) and 21($b$) are graphs showing the distribution of an ion current density and the uniformness in the eighth embodiment according to this invention.
Figure 21B:
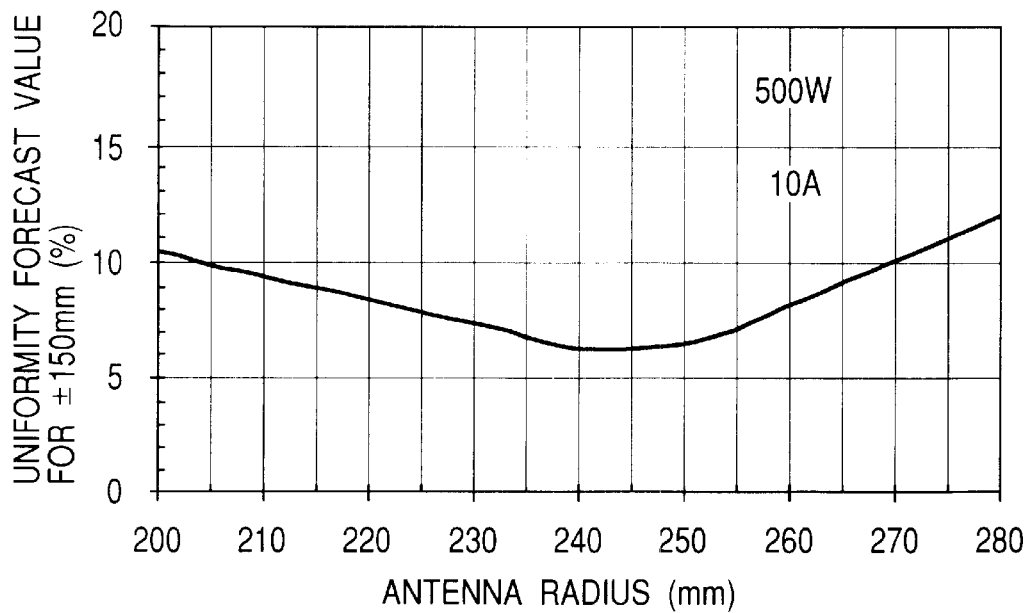
Figure 22A:
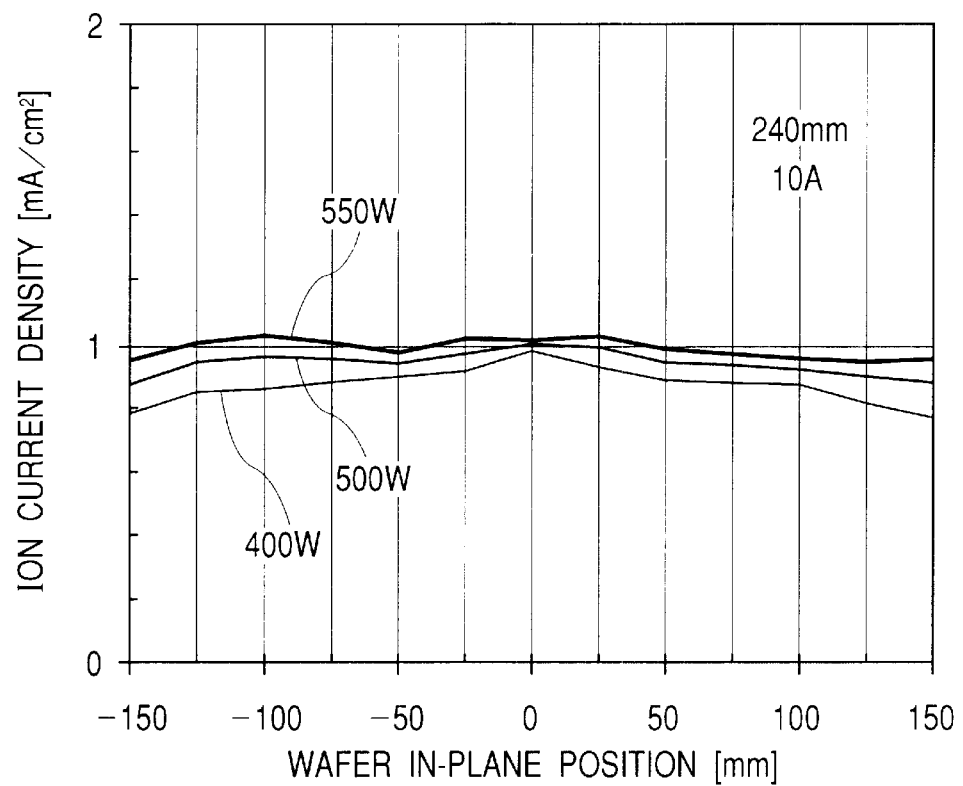
FIGS. 22($a$) and 22($b$) are graphs showing the distribution of an ion current density and the uniformness in the eighth embodiment according to this invention.

FIG. 21 shows an example when the UHF power is changed as another processing condition. FIG. 21(a) shows another embodiment in which the change of the uniformness of plasmas depending on the shape, that is, the antenna diameter of the antenna 108 as the processing condition is shown by the ion current density at the UHF power of 500 W (450 MHz). The result of measurement in a case of forming the plasmas at the coil current of 10 A is shown by solid circles for the antenna diameter of 225 mm and by blank circles for the antenna diameter of 270 mm. FIG. 21(b) shows the result of calculating the in-plane distribution characteristics of the ion current density to the wafer in-plane position at an arbitrary antenna diameter by using the correlation function on the two processing conditions, determining the uniformness of the plasmas along the diameter at ±150 mm and drawing the same relative to the antenna diameter. FIG. 22(a) shows the ion current density distribution. It can be estimated that the uniformness reaches a minimum value of 6.0% at the antenna diameter of 240 mm. FIG. 21(a) shows, by a solid line, the ion current density distribution of the plasmas at the antenna diameter of 240 mm to minimize the uniformness.

Figure 22B:
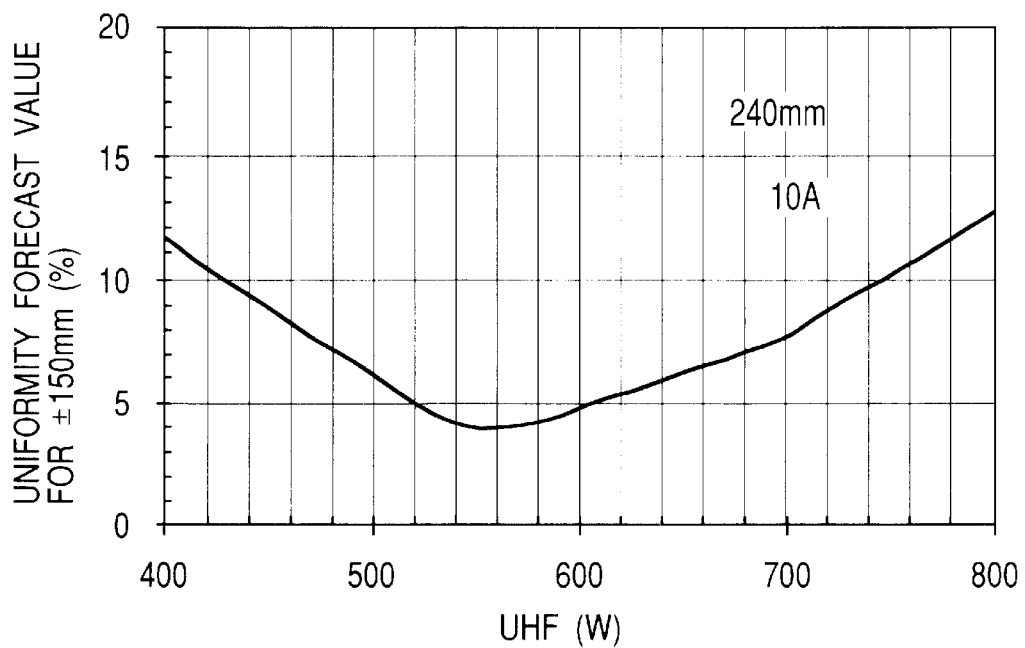

FIG. 22(b) shows the result of determining a correlation function by using the in-plane distribution characteristics of the ion current density of the plasmas at UHF power of 400 W and 500 W at the antenna diameter of 240 mm in which the uniformity is estimated minimum in FIG. 20(a) and FIG. 21(a), with the UHF power being as the processing condition, and calculating the in-plane distribution characteristics of the ion current density to an arbitrary UHF power value to calculate the uniformness along the diameter at ±150 mm. It can be estimated that the uniformness reaches a minimum value of 3.9%. FIG. 22(a) shows, by a solid line, the ion current density of plasmas at the UHF power of 550 W for the antenna diameter 240 mm in which the uniformness reaches minimum value of 3.9%.

The eighth embodiment shows an example of the feature capable of determining a more optimal processing condition by calculating the in-plane distribution characteristic and the uniformness characteristic in view of the in-plane distribution data of the ion current density within the wafer plane relative to two antenna diameter values under the two UHF power value conditions, and further determining the optimal value for the UHF power in view of the correlation function using the in-plane distribution characteristic relative to the UHF power under the optimal condition. By the combination of the processing conditions as described above, it is possible to calculate and forecast the processing conditions in the semiconductor producing apparatus optimal to the semiconductor producing step based on a few number of in-plane distribution data. As a result, since the optimal condition can be determined in a short period of time without sampling enormous amount of data and without conducting a experiment of trially manufacturing mechanical elements for the producing apparatus in various structures and dimensions, it can provide a feature capable of shortening the start-up time for the semiconductor producing process, that is, QTAT. As a result, it has a feature capable of reducing the producing cost.

Also for other factors giving effects on the uniformness of the plasmas, it will be apparent that the uniformness can be calculated to determine the optimum value by obtaining the in-plane distribution data under at least two different processing conditions to respective factors thereby determining the in-plane distribution characteristics by using the correlation functions successively as in the embodiments described previously.

(Embodiment 9)

FIG. 15 shows a producing step chart for the method of producing a semiconductor device in a ninth embodiment according to this invention. Functions of a semiconductor device such as DRAM are usually formed by repeating the steps of forming semiconductor substrate steps, forming wells, for isolation, forming transistors, forming bit lines, forming capacitors and forming wirings. The process is constituted by properly combining, for example, exposure, etching, heat treatment (oxidation, annealing, diffusion), ion implantation, thin film formation (CVD, sputtering, vapor deposition), cleaning (removal of resist and cleaning with solution) and inspection.

FIG. 15 shows an example of forming bit lines and forming capacitors among the production process for DRAM. Particularly, schematic views for the cross sectional structure of steps in which the device structure is changed are shown. In each of the drawings, the cross sectional structure of a memory cell part is shown on the light and a cross sectional structure of a peripheral CMOS part is shown on the left. The producing process proceeds from FIG. 15(a) to FIG. 15(b).

At first, a groove for device isolation is formed to a semiconductor substrate 201. Then, a silicon oxide film is formed on a substrate having the groove by a chemical vapor deposition process. Then, the surface of the silicon oxide film is polished by the method of producing the semiconductor device optimized in each of the chemical mechanical polishing steps shown in first to seventh embodiments and the silicon oxide film is buried in the groove. Subsequently, a gate oxide film and a gate electrode 204 and an impurity doped layer to form source and drain are formed. Further, an $SiO_2$ film (silicon oxide film) 203 as a passivation film is formed. By forming and exposing a resist film 202 on the oxide film, a resist pattern having an opening on the impurity doped layer forming the source region in the memory cell part is formed. The silicon oxide film on the impurity doped layer is etched in the memory cell part using the resist pattern as a mask (FIG. 15(a)).

Figure 15A:
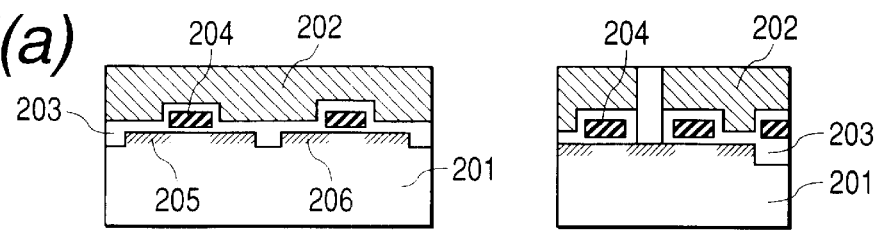
FIGS. 15($a$) through 15($g$) are production step charts for a method of producing a semiconductor device in a ninth embodiment according to this invention.
Figure 15B:
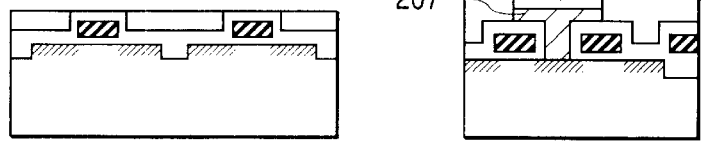
Figure 15C:
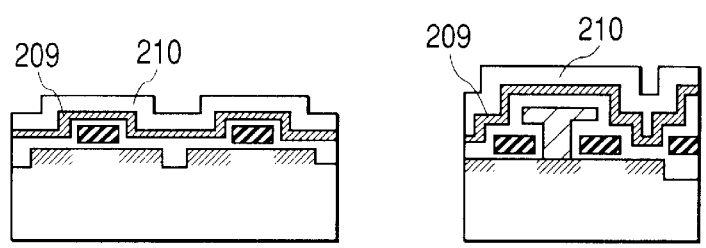
Figure 15D:
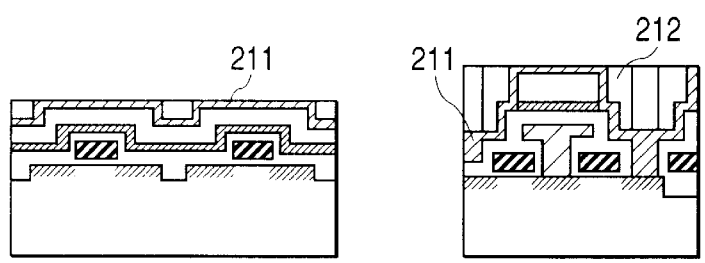
Figure 15E:
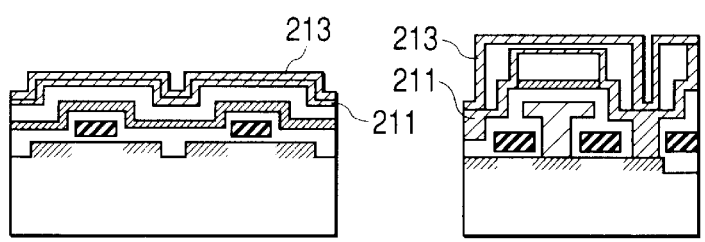

Then, after removing the resist film 202, a polycrystal silicon film and a silicon oxide film are formed and fabricated to form bit lines (FIG. 15(b)). Then, a silicon nitride film 209 and a silicon oxide film 210 are deposited (FIG. 15(c)). Then, an opening is formed to the insulation film on the impurity doped layer to form a drain in the memory cell part by using lithography and a dry etching technique optimized in the etching step shown in the eighth embodiment, and a poly-Si film (polysilicon film) 211 to form a first lower electrode of a storage capacitance (storage electrode) is formed. Further, a silicon oxide film 212 having an opening is formed on the polycrystal silicon on the impurity doped layer to form the drain (FIG. 15(d)). Then, a polycrystal silicon film as the second lower electrode of the storage capacitor (inside of the first electrode) is formed (FIG. 15(e)).

Figure 15F:
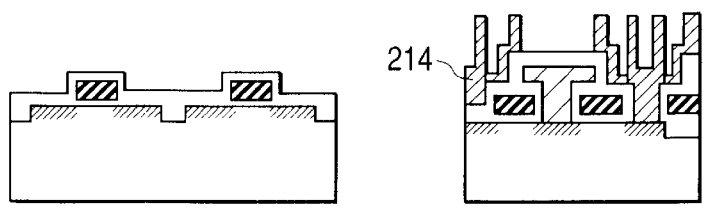
Figure 15G:
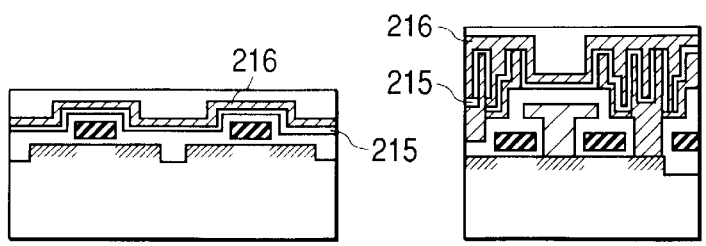

Then, the polycrystal silicon film on the upper surface is removed, and the silicon oxide film 212 and the silicon nitride film 209 are removed (FIG. 15(f)). Subsequently, a tantalum oxide film ($Ta_2O_5$ film) 215 (capacitor insulation film) is formed and a tungsten film (W film) 216 or a polycrystal silicon film as the upper electrode of the storage capacitor is formed (FIG. 15(g)).

Reference numerals in FIG. 15 denote the followings. That is, they denote semiconductor substrate 201, resist film 202, $SiO_2$ film (passivation film) 203, $Si_3N_4$ film 204, $n^+$ layer 205, $p^+$ layer 206, poly-Si film (poliside) 207, $SiO_2$ film 208, $Si_3N_4$ film 209, $SiO_2$ film 210, poly-Si film 211, SiO2 film 212, poly-Si films 213, 214, $Ta_2O_5$ film 215 and W (poly-Si) 216.

A semiconductor device having a high performance and high reliability can be provided easily by conducting chemical mechanical polishing step in each of the first to seventh embodiments and applying exposure with no alignment error in the exposure device prior to each of the processing such as $SiO_2$ film deposition, poly-Si film deposition, $Si_3N_4$ film deposition, poly-Si film etching, $SiO_2$ film etching, $Si_3N_4$ film etching, $Ta_2O_3$ film formation and W film formation. Upon chemical mechanical polishing for the $SiO_2$ film (passivation film) or the like, the processing efficiency can be improved outstandingly by making the polishing atmosphere such as a polishing liquid alkaline and applying mechanical polishing while rendering the surface of the thin film to be processed on the semiconductor substrate chemically reactive.

(Embodiment 10)

FIG. 16 is a schematic perspective view for a semiconductor device showing a method of producing a semiconductor device in a tenth embodiment according to this invention. An interlayer insulation film 221 such as an $SiO_2$ film is deposited to a film thickness corresponding to a wiring layer on a semiconductor substrate which is flattened by the method of producing the semiconductor device optimized in the chemical mechanical polishing step in each of the first to seventh embodiments according to this invention. Transistors are formed on the semiconductor substrate. Further, an etching stopper layer 220 such as of an SiN film is deposited in order to attain accuracy for the control of the etching depth in the wiring groove (FIG. 16(a)). After coating a resist film 222, a semiconductor substrate is placed on a fixed bed of this invention and a wiring groove pattern is exposed and transferred (FIG. 16(b)). After developing the resist, etching processing optimized in the etching step shown in the eighth embodiment is applied by using the residual resist film as a mask to form a wiring forming region 223 (FIG. 16(c)). Again, a resist film 224 is coated on the semiconductor substrate, the semiconductor substrate is placed on the fixed bed of this invention, a connection hole pattern is transferred by exposure, the resist film is developed and then etching optimized in the etching step shown in the eighth embodiment is applied to form connection holes 225 (FIG. 16(d)). After removing the resist film, metal such as W or Cu is buried and the surface of the substrate is flattened by the step of chemical mechanical polishing shown in each of the first to seventh embodiments according to this invention to form wirings 226 and wiring plugs 227 in connection with the not illustrated lower layer wirings (FIG. 16(e)). A semiconductor device having a fine multi-layered wiring layer can be manufactured at a high yield and easily by applying and repeating the steps described above in accordance with the necessity.

Figure 16A:
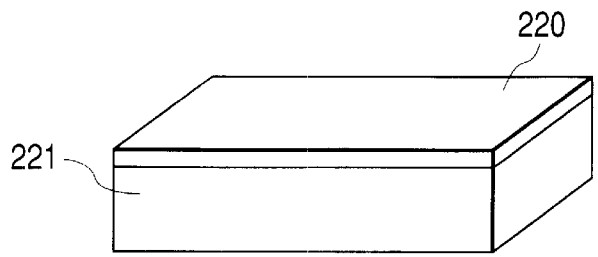
FIGS. 16($a$) through 16($e$) are schematic perspective views of the producing step chart for a method of producing a semiconductor device in a tenth embodiment according to this invention FIGS. 17($a$) through 17($g$) are producing step charts for a method of producing a semiconductor device in an eleventh embodiment according to this invention.
Figure 16B:
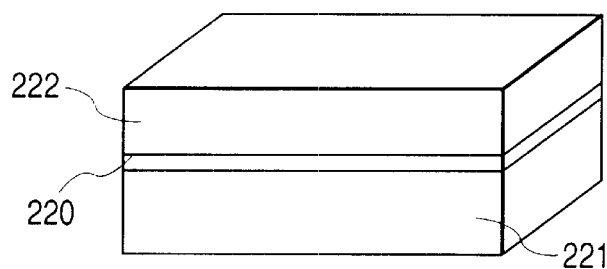
Figure 16C:
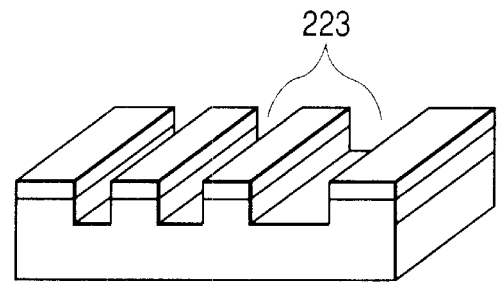
Figure 16D:
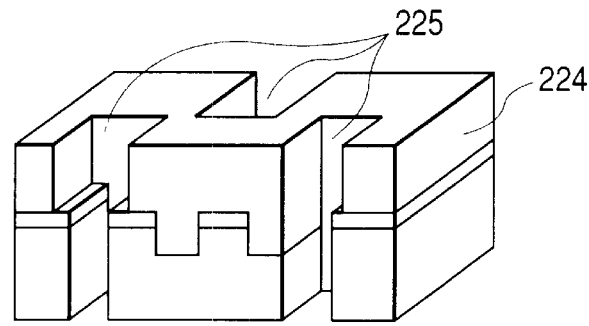
Figure 16E:
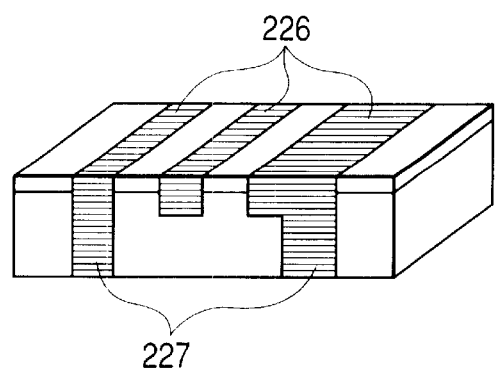
Figure 17A:
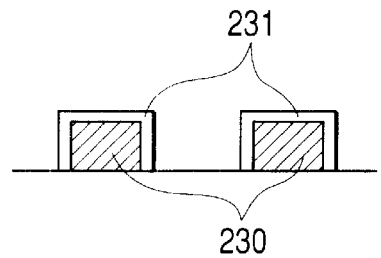
Figure 17B:
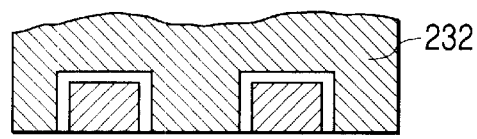
Figure 17C:
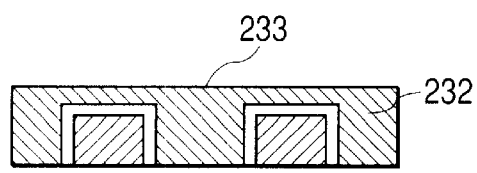
Figure 17D:
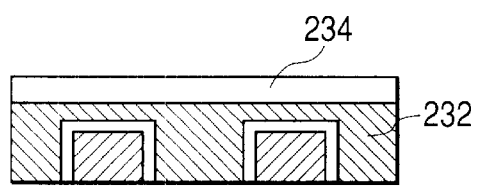
Figure 17E:
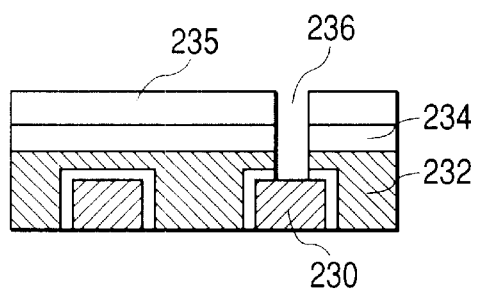
Figure 17F:
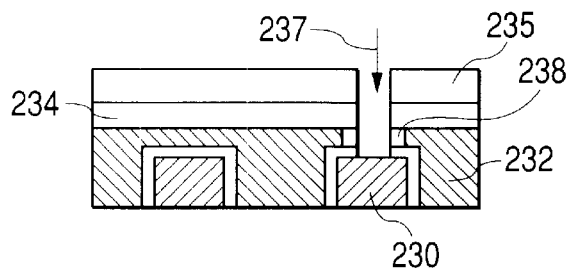
Figure 17G:
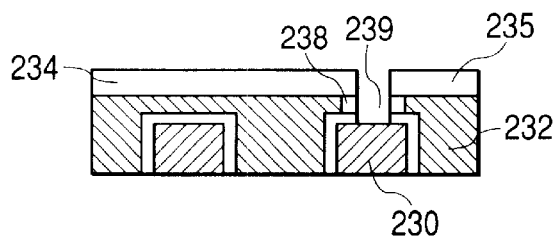

In the chemical mechanical polishing for the metal as shown in FIG. 16(d), the working efficiency can be improved outstandingly by making the polishing atmosphere such as a processing liquid acidic and applying mechanical polishing while chemically attacking the surface of the metal thin film to be processed on the semiconductor substrate. As an oxidizer, hydrogen peroxide or iron nitrate can be utilized. Further, $Al_2O_3$ or $MnO_2$ can be utilized as the abrasive grains. Further, it is also effective to use the oxidation suppressing agent such as BTA for controlling the processing end point by utilizing the chemical selectivity.

(Embodiment 11)

FIG. 17 is a producing step chart for a method of producing a semiconductor device in an eleventh embodiment according to this invention. This is a step of using an organic SOG film as one of low dielectric constant insulation films for reducing the inter-wiring capacitance. A metal wiring 230 such as made of Al is formed on a semiconductor substrate, and an oxide film 231 such as made of $SiO_2$ is formed as an underlayer cover film (FIG. 17(a)). Then, An $SiO_2$ film 232 is coated (FIG. 17(b)). A flat surface 233 is formed by the step for the method of producing the semiconductor device optimized in the chemical mechanical polishing step shown in each of the first to seventh embodiments according to this invention for the substrate surface. An oxide film 234 as a cap for providing an oxygen plasma resistance is formed (FIG. 17(d)). After coating a resist film 235 on the semiconductor substrate, the semiconductor substrate is placed on a fixed bed, exposed and transferred with a connection hole pattern, the resist is developed and then etching is applied by using the residual resist film as a mask to form a contact hole 236 (FIG. 17(e)). Then, an oxide layer 238 of 10 nm thickness is formed on the surface of a via hole 239 (FIG. 17(f)). Then, after removing the resist film 235 and burying a metal in the via 239, flattening is applied by the step of chemical mechanical polishing shown in each of the first to seventh embodiments according to this invention (FIG. 17(g)). Since the organic SOG film is covered with the oxide film 234 and the oxide layer 238, it can withstand oxygen plasma processing. Further, in conjunction with the stopper effect upon conducting flattening by the chemical mechanical polishing, the processing accuracy for flattening is improved. As a result, a semiconductor device of higher performance can be manufactured easily.

(Embodiment 12)

Figure 18A:
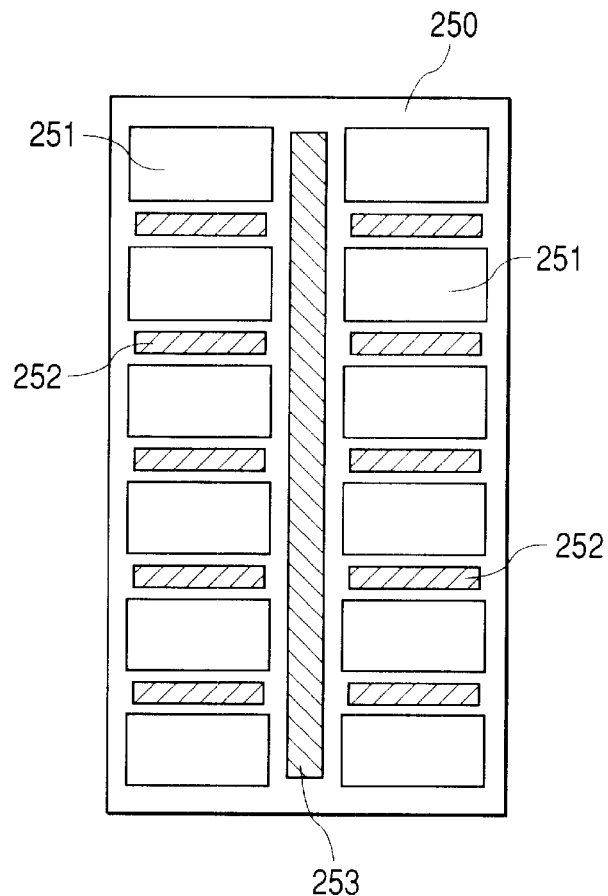
FIGS. 18($a$) and 18($b$) are schematic plan views of a semiconductor device in a twelfth embodiment according to this invention.
Figure 18B:
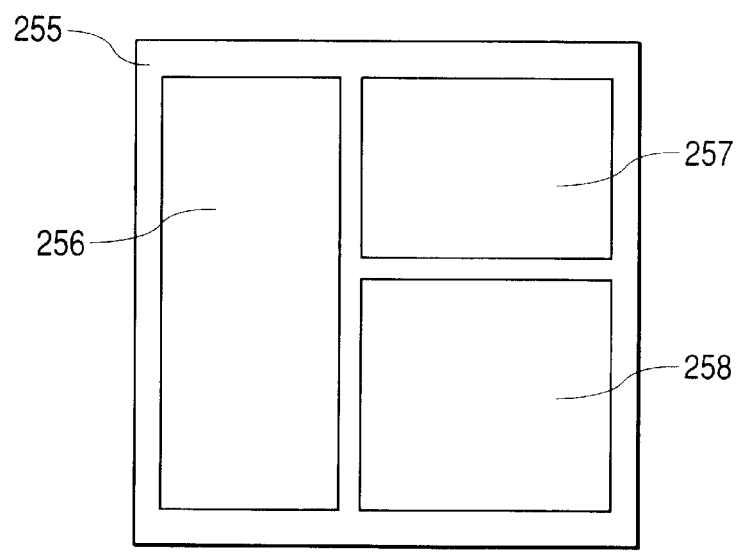

FIG. 18 is a schematic plan view of a semiconductor device in a twelfth embodiment according to this invention. FIG. 18(a) is a schematic plan view for an example of a memory LSI prepared by a method of producing a semiconductor device shown in each of the ninth to eleventh embodiments. A memory LSI 250 comprises a plurality of memory arrays 251, peripheral circuit A 252 and a peripheral circuit B 253 situated at the central area of the chip. FIG. 18(b) is a schematic plan view for an example of a system LSI prepared by a method of producing the semiconductor device shown in each of the ninth to eleventh embodiments. The system LSI 255 mainly comprises a logic block 256, a memory block A 257 and a memory block B 258. The logic block is for operation and control circuit portions, the memory block A is a memory circuit part not requiring refreshing operation such as SRAM (Static Random Access Memory), and the memory block B is a memory circuit part requiring refreshing operation such as DRAM. In the system LSI, circuits of various functions such as control operation circuits and memory circuits, as well as dedicated circuits such as for image display, communication control, voice synthesis and recognition can be mounted together on one identical chip and, as a result, this provides a feature capable of improving the performance such as high speed data processing and reduced consumption power compared with systems constituted by connecting LSIs of single function circuits by way of busses.

As a result of producing the semiconductor device by the steps according to this invention as shown in ninth to twelfth embodiments, the yield in the wafer flattening step is improved thereby improving the yield of the semiconductor device by about 20%.

For the step of producing the semiconductor device, while the chemical mechanical polishing step and the etching step have been described specifically in the embodiments according to this invention, it will be apparent that this invention is applicable also to the optimization of other producing steps and producing devices of semiconductor devices requiring high accuracy for the uniformness within the wafer plane.

As has been described above, according to the processing method of this invention, since processing conditions can be presented with a high accuracy, processing can be conducted at a high yield. Further, according to the method of producing the semiconductor device of this invention, since processing condition can be presented with a high accuracy, the productivity can be improved. Further, according to the measuring method of this invention, data for obtaining products with a high accuracy can be obtained.

What is claimed is:

1. A processing method comprising:

a step of applying a first processing to a first substrate;

a step of applying a second processing to the first substrate or applying the second processing to a second substrate;

determining a correlation function for in-plane positions of the first and second processed substrate along a diameter of the substrate from outer periphery to the central area of the substrate as data for the difference in the first and second processing steps for each of in-plane positions, based on the in-plane distribution data of the first and second processed substrate for the in-plane position of each of the substrate as the result of the first and second processing;

calculating the in-plane distribution characteristics of third substrate under a desired processing condition in view of the correlation function, and processing the third substrate based on the in-plane distribution characteristics.

2. A processing method comprising:

a step of applying a first processing to a first substrate;

a step of applying a second processing to the first substrate or applying the second processing to a second substrate;

determining a correlation function for in-plane positions of the first an second processed substrate along a diameter of the substrate from outer periphery to the central area of the substrate as data for the difference in the first and second processing steps for each of in-plane positions, based on the in-plane distribution data of the first and second processed substrate for the in-plane position of each of the substrate as the result of the first and second processing;

calculating the in-plane distribution characteristics of third substrate under a desired processing condition in view of the correlation function, and processing the third substrate in view of the in-plane distribution characteristics, based on the in-plane distribution characteristics.

3. A processing method as defined in claim 1, wherein each of the first processing and the second processing is chemical mechanical polishing.

4. A processing method as defined in claim 3, wherein the chemical mechanical polishing uses a slurry containing an abrasive agent or abrasive grains as a processing liquid to apply chemical and mechanical processing using a polishing pad.

5. A processing method as defined in claim 3, wherein the chemical mechanical polishing uses a fixed abrasive grain disk formed by fixing abrasive grains with a resin or a grindstone to apply chemical and mechanical processing.

6. A method of producing a semiconductor device having a transistor and a capacitor, wherein a desired surface on a semiconductor substrate is processed by chemical mechanical polishing, comprising comprising:

a step of applying a first processing to a first substrate;

a step of applying a second processing to the first substrate or applying the second processing to a second substrate;

determining a correlation function for in-plane positions of the first and second processed substrate along a diameter of the substrate from outer periphery to the central area of the substrate as data for the difference in the first and second processing steps for each of in-plane positions, based on the in-plane distribution data of the first and second processed substrate for the in-plane position of each of the substrate as the result of the first and second processing;

calculating the in-plane distribution characteristics of third substrate under a desired processing condition in view of the correlation function, and processing the third substrate based on the in-plane distribution characteristics.

* * * * *